(12) United States Patent
Soma

(10) Patent No.: US 10,840,898 B2
(45) Date of Patent: Nov. 17, 2020

(54) SEMICONDUCTOR DEVICE AND ELECTRONIC CONTROL DEVICE

(71) Applicant: RENESAS ELECTRONICS CORPORATION, Tokyo (JP)

(72) Inventor: Osamu Soma, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/452,205

(22) Filed: Jun. 25, 2019

(65) Prior Publication Data

US 2020/0028503 A1 Jan. 23, 2020

(30) Foreign Application Priority Data

Jul. 20, 2018 (JP) ................................ 2018-136573

(51) Int. Cl.
*H03K 17/0412* (2006.01)
*H02J 7/00* (2006.01)
*H03K 17/16* (2006.01)

(52) U.S. Cl.
CPC ...... *H03K 17/04123* (2013.01); *H02J 7/0031* (2013.01); *H03K 17/163* (2013.01)

(58) Field of Classification Search
CPC ................ H03K 17/04; H03K 17/041; H03K 17/04106; H03K 17/0412; H03K 17/04123; H03K 17/16; H03K 17/161; H03K 17/162; H03K 17/163; H03K 17/164; H02J 7/0031; H02J 7/0032

See application file for complete search history.

(56) References Cited

U.S. PATENT DOCUMENTS

| 7,737,664 B2* | 6/2010 | Matsunaga | ........... H01M 10/44 320/134 |
| 9,007,026 B2* | 4/2015 | Sakurai | ................. H02J 7/0031 320/128 |
| 2018/0337550 A1* | 11/2018 | Agrelo | ................... H01G 11/52 |

FOREIGN PATENT DOCUMENTS

| JP | 2003-037933 A | 2/2003 |
| JP | 2007-082374 A | 3/2007 |

* cited by examiner

*Primary Examiner* — Diana J. Cheng
(74) *Attorney, Agent, or Firm* — McDermott Will & Emery LLP

(57) ABSTRACT

A semiconductor device and electronic control device capable of shutting off the reverse current flow from a load to a power supply is provided.
The power transistor QN1 is provided between the positive power supply terminal Pi2(+) and the load-driving terminal Po2(+), and has a source and a back-gate coupled to the positive power supply terminal Pi2(+). The power transistor QN2 is provided in series with the power transistor QN1, and its sources and backgates are coupled to the load-driving terminal Po2(+). The booster CP1a charges the gates of the power transistors QN1. The gate discharge circuit DCG1a discharges the gate charge of the power transistor QN1 to the source when the potential of the negative power supply terminal Pi2(−) is higher than the potential of the positive power supply terminal Pi2(+).

19 Claims, 17 Drawing Sheets

SEMICONDUCTOR DEVICE AND ELECTRONIC CONTROL DEVICE

CROSS-REFERENCE TO RELATED APPLICATIONS

The disclosure of Japanese Patent Application No. 2018-136573 filed on Jul. 20, 2018 including the specification, drawings and abstract is incorporated herein by reference in its entirety.

BACKGROUND

The present disclosure relates to a semiconductor device and an electronic control device, for example, to a technique for shutting off a reverse current from a load to a power supply.

In Japanese unexamined Patent Application publication No. 2007-82374 (herein after, "Patent Document 1"), there is disclosed a power supply reverse connection protection circuit including an n-channel FET [1] and an n-channel FET [2] in order from the positive terminal side on a power supply path from a positive terminal of a battery to a power supply target. The drains of the FET [1] and the FET [2] are connected in common, and the gate voltages of the FET [1] and the FET [2] are generated by a charge pump circuit to which operating power is supplied from the drain side.

In Japanese unexamined Patent Application publication No. 2003-37933 (herein after "Patent Document 2"), there is disclosed a protective device including p-channel FETs having drains on the power supply terminal side on a power supply path from a power supply terminal on the positive electrode side to a power supply input terminal of an electronic device. The gate of the p-channel FET is connected to the power supply terminal on the negative electrode side via a resistor, and further connected to the source via a capacitor.

SUMMARY

For example, in an electronic control device (Electronic Control Unit) or the like for vehicles, relays composed of two series transistors may be provided to control the energization between power supplies and loads. One of the two series transistors is required to shut off the reverse conduction from the load to the power supply. On the other hand, it is desirable that the two series transistors are of an n-channel type as shown in Patent Document 1 in order to reduce the size and loss of the relay. However, in the configuration as shown in Patent Document 1, there is a fear that the energization in the opposite direction cannot be cut off.

The embodiments described below have been made in view of the above, and other problems and novel features will be apparent from the description of the present specification and the accompanying drawings.

A semiconductor device according to one embodiment includes a positive power supply terminal and a negative power supply terminal coupled to a power supply, and a load drive terminal coupled to a load for controlling the energization between the power supply and the load in response to control inputs. The semiconductor device includes an n-channel first power transistor and a second power transistor, a first booster circuit, and a first gate discharge circuit. The first power transistor is provided between the positive power supply terminal and the load drive terminal, and has a source and a back gate coupled to the positive power supply terminal side and a drain coupled to the load drive terminal side. The second power transistor is provided in series with the first power transistor between the positive power supply terminal and the load drive terminal, and the source and the back gate are coupled to the load drive terminal side and the drain is coupled to the positive power supply terminal side. The first booster circuit charges the gate of the first power transistor. The first gate discharge circuit discharges the gate charge of the first power transistor to the source when the potential of the negative power supply terminal is higher than the potential of the positive power supply terminal.

According to the above-mentioned embodiment, it is possible to cut off the reverse current supply from the load to the power supply.

DETAILED DESCRIPTION

Figure 1:
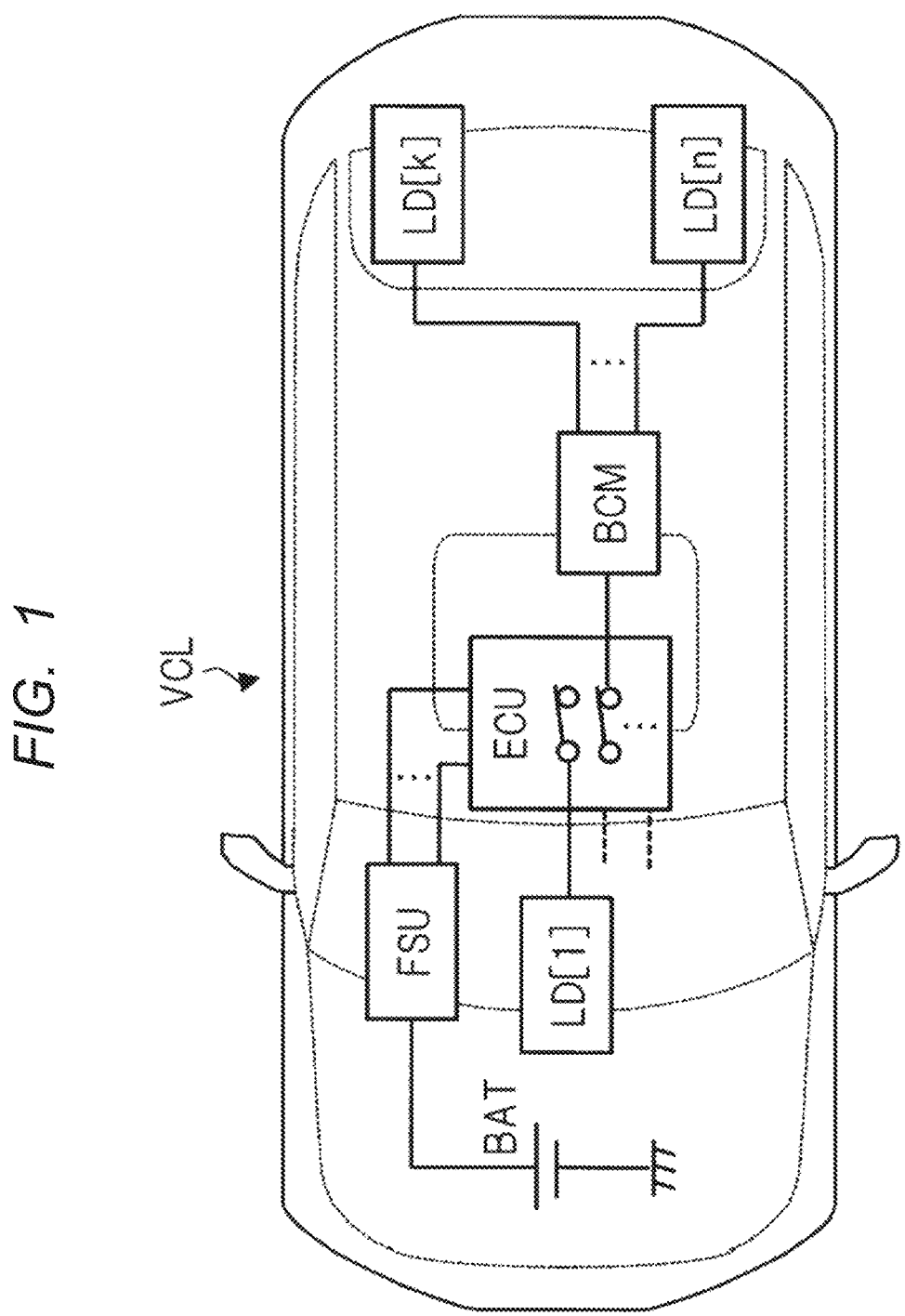
FIG. 1 is a schematic diagram showing a configuration example of a vehicle to which an electronic control device according to the first embodiment of the present invention is applied.

In the following embodiments, when required for convenience, the description will be made by dividing into a plurality of sections or embodiments, but except when specifically stated, these sections and embodiments are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be more than or less than a specific number, except for cases where the number is specifically indicated or is clearly limited to the specific number in principle.

Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

In addition, although MOSFET (Metal Oxide Semiconductor Field Effect Transistor (referred to as a MOS transistor) is used as an example of the MISFET (Metal Insulator Semiconductor Field Effect Transistor) in the embodiment, a non-oxide film is not excluded as the gate insulating film. In this embodiment, a p-channel MOSFET is referred to as a pMOS transistor, and an n-channel MOSFET is referred to as a nMOS transistor.

In all the drawings for explaining the embodiments, the same members are denoted by the same reference numerals in principle, and repetitive descriptions thereof are omitted.

First Embodiment

FIG. 1 is a schematic diagram showing an exemplary configuration of a vehicle to which an electronic control device according to the present first embodiment is applied. The vehicle (e.g. motor vehicle) VCL shown in FIG. 1 comprises a battery BAT, a fuse box FSU, an electronic control device (in particular a relay box) ECU, a body control module BCM, and a plurality of loads LD[1], . . . , LD[k], . . . , LD[n]. The fuse boxes FSUs serve to transmit the power of the batteries BATs to the electronically controlled device ECUs and to protect them from high currents.

The loads LD[1] to LD[n] are various electric components for an automobile, and correspond to, for example, a DC motor, a lamp, a heater, various inductance loads, various capacitor loads, and the like. The body control module BCM controls various loads, here LD[k], . . . , LD[n]. The electronic control device (relay box) ECU includes a plurality of relays (switches), and supplies power of the battery BAT transmitted through the fuse box FSU to various loads (here, LD[1], . . . ) and the body control modules BCM through the relays. That is, the electronic control device ECUs control the energization between the batteries BATs and the loads.

Here, it is desirable that the electronic control device ECUs have low losses in relation to supplying the electric power of the battery BATs to various loads. In addition, it is desirable that electronically controlled device ECUs be compact. Since the restriction on the installation place of the relay box is alleviated by the miniaturization, for example, the efficiency of the wiring route by the wire harness can be improved. The efficiency of the wiring route contributes to reduction in weight, cost, loss, and the like of the vehicle.

Figure 2:
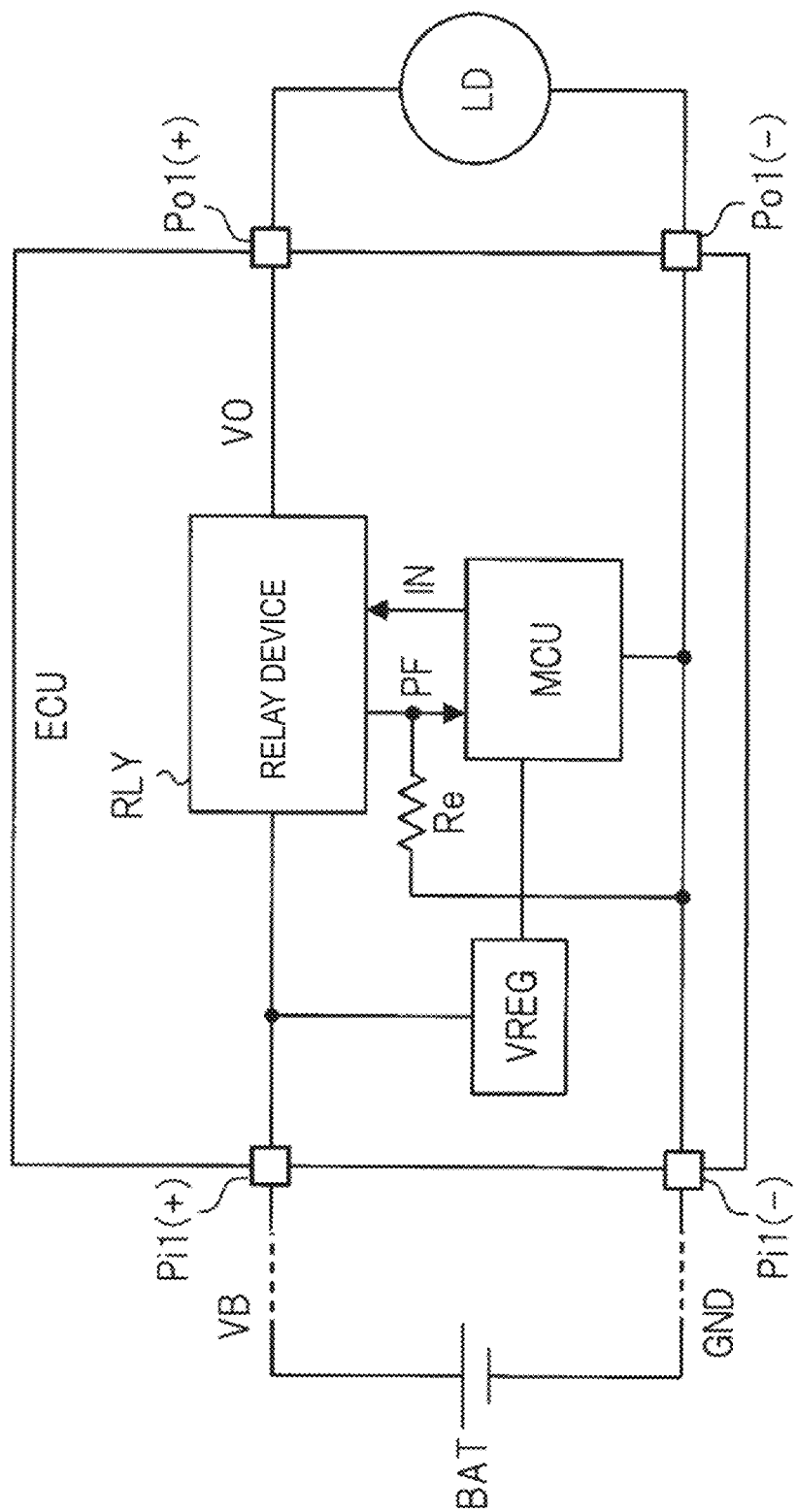
FIG. 2 is a schematic diagram illustrating an exemplary configuration of a main part of an electronic control device.

FIG. 2 is a schematic diagram showing an exemplary configuration of a main part of the electronic control device in FIG. 1. The electronic control device ECU shown in FIG. 2 includes a micro-controller MCU, a relay device RLY, a power supply regulator VREG, and an external resistor Re, which are mounted on a printed circuit board. The electronic control device ECUs are supplied with a battery power source (also referred to as a battery power source potential) VB on the high potential side from the battery BAT via a battery terminal Pi1(+) on the positive electrode side. The electronic control device ECUs are supplied with a low-potential-side battery power source (also referred to as a grounding power source potential) GND from the battery BAT via the negative-electrode-side battery terminal Pi1(−). When the grounding power supply potential GND is 0 V, the battery power supply potential VB is typically 12 V or the like.

The power regulator VREG generates a power source (e.g., a 5 V) for the microcontroller MCU from the battery power source VB. As is widely known, the microcontroller MCU includes a memory for storing various programs and data, a processor for executing the programs stored in the memory, various analog peripheral circuits, and various digital peripheral circuits. The device RLYs control the energization between the batteries BATs and the loads LDs in response to control input signal IN from the MCUs. Specifically, the relay device RLY controls energization from the battery BAT to the load LD to be on when the control input signal IN is asserted, and to be off when the control input signal IN is negated.

In addition, the relay device RLY includes a diagnostic circuit for executing self-diagnosis. The relay device RLY outputs a result notification signal PF, which is a result of diagnosis by the diagnostic circuit, to the microcontroller MCU. In this embodiment, when the diagnostic result is abnormal, the relay device RLY notifies the microcontroller MCU of the abnormality by controlling the potential level of the result notification signal PF to a predetermined level via the external resistor Re. The microcontroller MCU recognizes the abnormality by converting the potential level of the result notification signal PF into a digital signal by an analog-to-digital conversion circuit.

The load LD is coupled to the positive load drive terminal Po1(+) and the negative load drive terminal Po1(−) of the electronic control device ECUs. The output potential VO from the relay device RLY is applied to the load drive terminal Po1(+), and the ground power supply potential GND is applied to the load drive terminal Po1(−) together with the battery terminal Pi1(−). The electronically controlled device ECUs are actually not limited to one relay device RLY, but include a plurality of relays device RLY.

Figure 17:
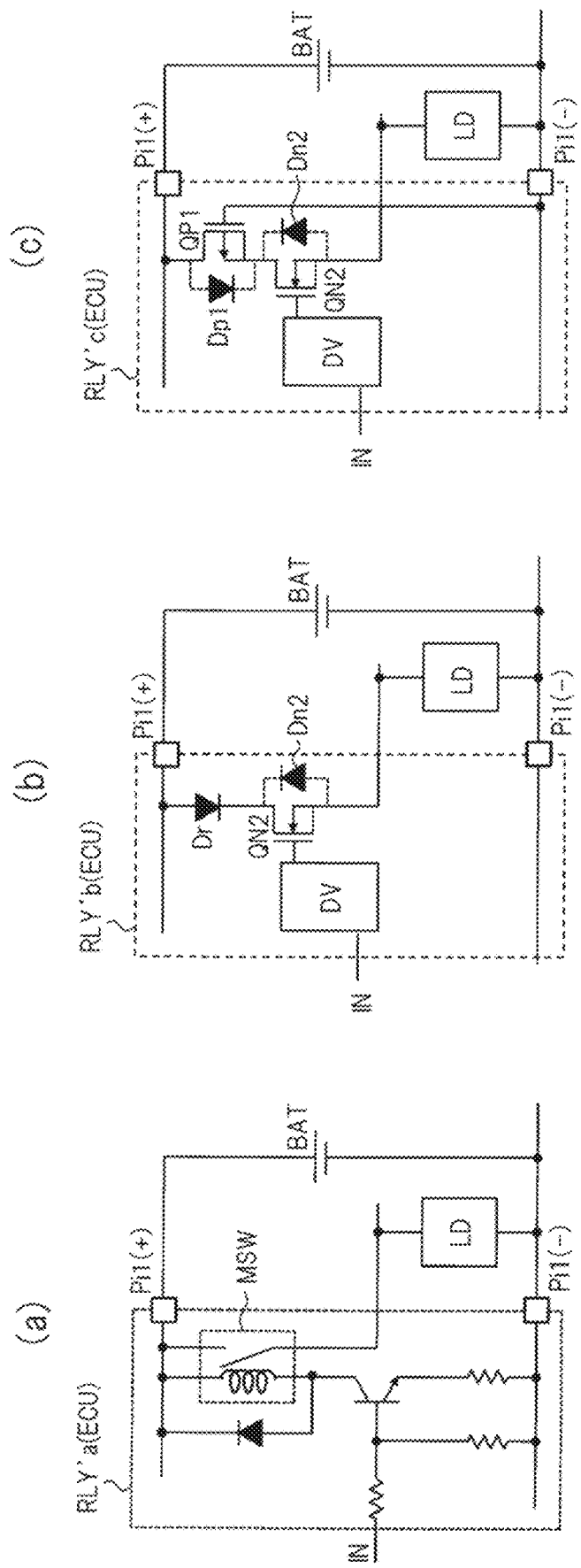
FIG. 17 is schematic diagrams ((a), (b) and (c)) illustrating different configurations of the relay device as the first comparative example of the present invention.

FIGS. 17(a), 17(b) and 17(c) are schematic diagrams showing different configuration examples of the relay device as the first comparative example. In FIG. 2, for example, in the case where the load LD is a DC motor or the like, if the battery BAT is connected in reverse by mistake, reverse rotation (i.e., malfunction) occurs due to the reverse direction of energization. For this reason, the relay device RLY is required to cut off such reverse energization.

The relay device RLY'a shown in FIG. 17(a) includes mechanical switches (mechanical relays) MSW for energizing the loads LDs. Since the mechanical switch MSW is mechanically opened at the time of OFF, when the battery BAT is reversely connected, the current supply in the reverse direction can be cut off. However, when the mechanical switch MSW is used, it is difficult to miniaturize the mechanical switch MSW, so that the installation location of the relay device RLY'a can be limited. In addition, since the mechanical switch MSW has a contact life, the installation location of the relay device RLY'a can be limited due to the need for maintenance.

The relay device RLY'b shown in FIG. 17(b) includes a diode Dr and an n-channel type power transistor (for example, a MOSFET) QN2 coupled in series, and the series circuit energizes the load LD. The back-gate and the source of the power transistor QN2 are coupled to the load LD, and the on/off of the power transistor QN2 is controlled by the driver DV receiving the control input signal IN. The power transistor QN2 includes a parasitic diode Dn2 between a source (back-gate) and a drain, the parasitic diode QN2 having a cathode on the drain side (anode on the source side). Therefore, for example, when the battery BAT is reversely connected, the power transistor QN2 is reversely energized through the parasitic diodes Dn2 even when the battery BAT is in the off-state.

Therefore, diodes Dr having the power transistor QN2 as a cathode are provided. When the battery BAT is reversely connected, the diode Dr can cut off the current in the reverse direction unless it breaks down. As described above, by using the semiconductor element Dr and the semiconductor element QN2, the relay device RLY'b can be reduced in size as compared with the case where the mechanical switch MSW is used. However, when the diode Dr is used, a loss accompanied by the forward voltage occurs when the forward current (i.e., the current from the battery BAT to the load LD) is supplied, so that a problem remains from the standpoint of reducing the loss.

In the relay device RLY'c shown in FIG. 17(c), a p-channel type power transistor (for example, a MOSFET) QP1 is provided instead of the diode Dr shown in FIG. 17(c). The power transistor QP1 has a parasitic diode Dp1 whose source is coupled to the power transistor QN2 side and whose cathode is the power transistor QN2 side. The power transistor QP1 is turned on when the gate thereof is coupled to the negative battery terminal Pi1(−) and the battery BAT is connected in sequence. On the other hand, when the battery BAT is reversely connected, the power transistor QP1 is turned off, and the parasitic diodes Dp1 of the power transistor BAT are also reversely biased, so that the reverse current supply is cut off.

As described above, by using the p-channel type power transistor QP1 instead of the diode Dr, it is possible to solve the problems of the forward voltages as described in FIG. 17(b). However, when the p-channel type is used, the on-resistance in the same area is increased as compared with the case where the n-channel type is used. As a result, it is disadvantageous in terms of miniaturization or low loss as compared with the case of using the n-channel type. When the p-channel type is used, since the gate-source voltage of the power transistor QP1 is determined by the battery power supply potential VB, the on-resistance of the power transistor QP1 may be increased when the battery power supply potential VB is low.

Figure 3:
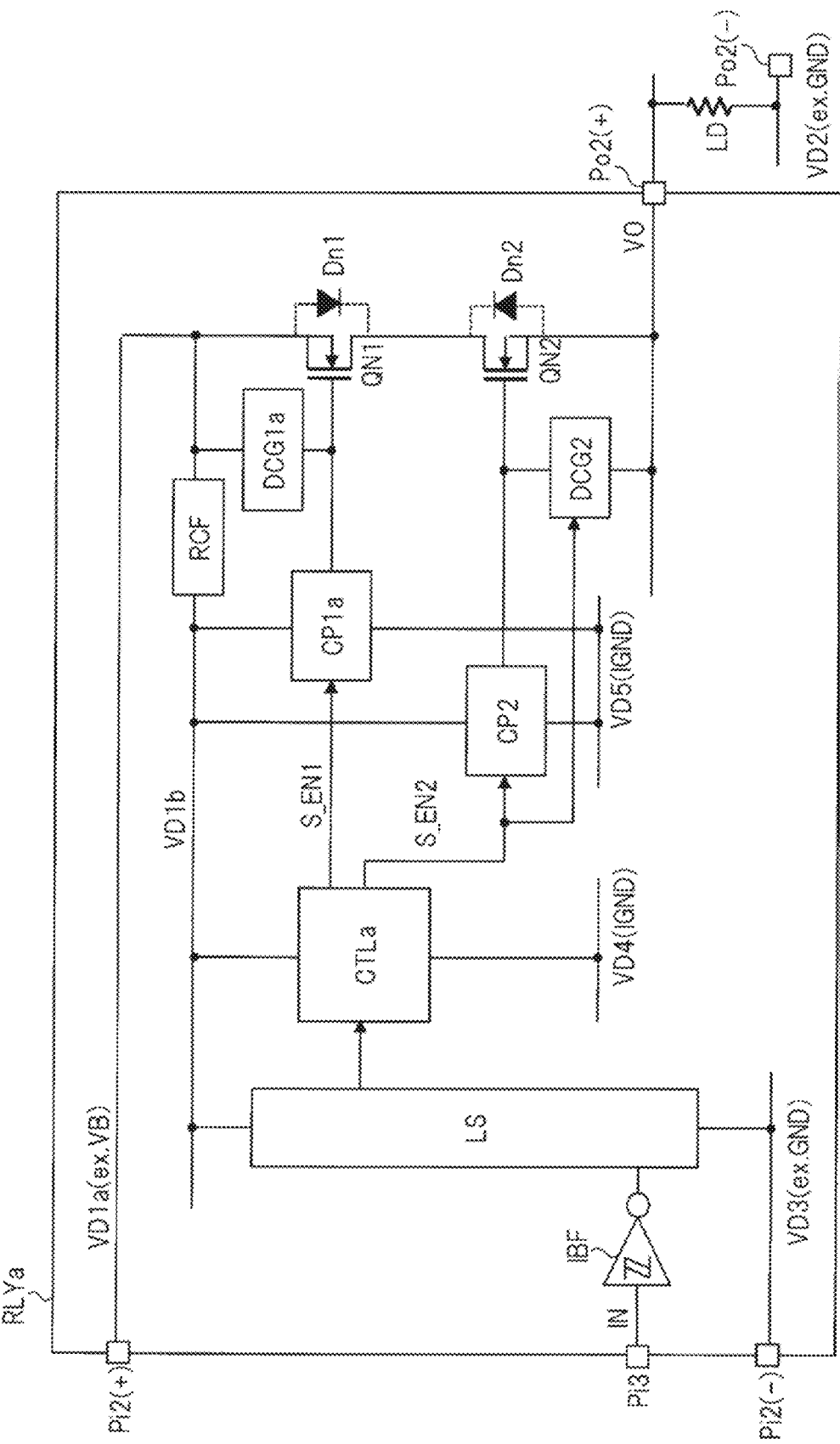
FIG. 3 is a block diagram showing a schematic configuration example of a semiconductor device (relay device) according to the first embodiment.

FIG. 3 is a block diagram showing a schematic configuration of a semiconductor device (relay device) according to the first embodiment. The semiconductor device (relay device) RLYa shown in FIG. 3 is, for example, an intelligent power device (IPD) composed of one semiconductor package, and is applied to the relay device RLY shown in FIG. 2. The relay device RLYa includes a positive power supply terminal Pi2(+) and a negative power supply terminal Pi2(−) coupled to the power supply, a positive load drive terminal Po2(+) coupled to the load LD, and a control input terminal Pi3 to which the control input signal IN is input. The other end of the load LD is coupled to the negative load driving terminal Po2(−).

The positive power supply terminal Pi2(+) is coupled to the power supply (power supply potential) [1a] VD1a and the negative power supply terminal Pi2(−) is coupled to the power supply (power supply potential) [3] VD3. The negative-side load-driving terminal Po2(−) is coupled to the power supply (power supply potential) [2] VD2. As shown in FIG. 2, when the battery BAT is coupled to the positive power supply terminal Pi2(+) and the negative power supply terminal Pi2(−), the power supply potential [1a] VD1a becomes the battery power supply potential VB, and the power supply potential [3] VD3 becomes the grounding power supply potential GND. The power supply potential [2] VD2 is also the grounding power supply potential GND. The power supply [3] VD3 is used as a ground power source for control, and the power supply [2] VD2 is used as a ground power source for power.

The relay device RLYa includes an input buffer IBF, a level shifter LS, a control circuit CTLa, booster circuits CP1a and CP2, a backflow preventing circuit RCF, gate-discharge circuits DCG1a and DCG2, and power transistors QN1 and QN2. The backflow preventing circuit RCF conducts the power supply [1a] VD1a and the power supply [1b] VD1b when the circuit RCF is "VD1a>VD3" (i.e., the battery BAT is connected in the forward direction), and cuts off the power supply [1a] VD1a and the power supply [1b] VD1b when the circuit RCF is "VD1a<VD3" (i.e., the battery BAT is connected in the reverse direction). Power supply (power supply potential) [1b] VD1b is a high-potential internal power supply (internal power supply potential).

The power transistors QN1 and QN2 are, for example, n-channel MOSFETs. The power transistor QN1 is provided between the positive power supply terminal Pi2(+) and the positive load drive terminal Po2(+), and has its source and back gates coupled to the positive power supply terminal Pi2(+) side and its drain coupled to the load drive terminal Po2(+) side. The power transistor QN2 is provided between the positive power supply terminal Pi2(+) and the positive load drive terminal Po2(+) in series with the power transistor QN1, and has a source and a back gate coupled to the load drive terminal Po2(+) side and a drain coupled to the positive power supply terminal Pi2(+) side. The output potential VO corresponding to the ON/OFF state of the power transistor QN1,QN2 is applied to the positive load driving terminal Po2(+).

The input buffer IBF receives a control input signal IN from the control input terminal Pi3, and outputs the control input signal IN to the control circuit CTLa via the level shifter LS. The level shifter LS converts the control input signal IN, which changes at a predetermined amplitude with the grounding power supply potential GND set at the 'L' level, into a signal, which changes at a predetermined amplitude with the power supply potential [1b] VD1b set at the 'H' level. The control circuit CTLa operates with the power supply (power supply potential) [4] VD4 as a reference, and the control circuit operates with the power supply [1b] VD1b. The power supply [4] VD4 is an internally grounded power supply IGND, and is generated, for example, by stepping down the power supply [1b] VD1b by a predetermined potential. For example, when the power supply potential [1b] VD1b is 12 V, the power supply potential [4] VD4 is 6 V or the like. The power supply [4]

VD4 is a variable power supply, and is short-circuited to the power supply [1b] VD1b for power saving during standby.

The control circuit CTLa outputs the enable signal S_EN1 to the booster circuit CP1a and outputs the enable signal S_EN2 to the booster circuit CP2 in response to the control input signal IN. Specifically, for example, when the control input signal IN is asserted, the control circuit CTLa asserts both the enable signals S_EN1 and S_EN2, and when the control input signal IN is negated, the control circuit CTLa negates both the enable signals S_EN1 and S_EN2.

The booster circuits CP1a and CP2 operate with the power supply (power supply potential) [5] VD5 as a reference and the power supply [1b] VD1b. The power supply [5] VD5 is an internally grounded power supply IGND, and is generated and controlled in the same manner as in the power supply [4] VD4. The step-up circuit CP1a generates a voltage boost potential (specifically, a power potential higher than the power potential [1a] VD1a) for turning on the power transistor QN1 in response to the assert of the enable signal S_EN1, and charges the gate of the power transistor QN1 at the voltage boost potential. Similarly, the booster CP2 generates a boosted potential for turning on the power transistor QN2 in response to assertion of the enable signal S_EN2, and charges the gates of the power transistors QN2 with the boosted potential.

The gate discharge circuit DCG1a discharges the gate charge of the power transistor QN1 to the source when the potential of the negative power supply terminal Pi2(−) is higher than the potential of the positive power supply terminal Pi2(+) (i.e., when the battery BAT is reversely connected). On the other hand, unlike the gate discharge circuit DCG1a, the gate discharge circuit DCG2 discharges the gate charge of the power transistor QN2 to the source in response to the negate of the enable signal S_EN2.

Figure 4:
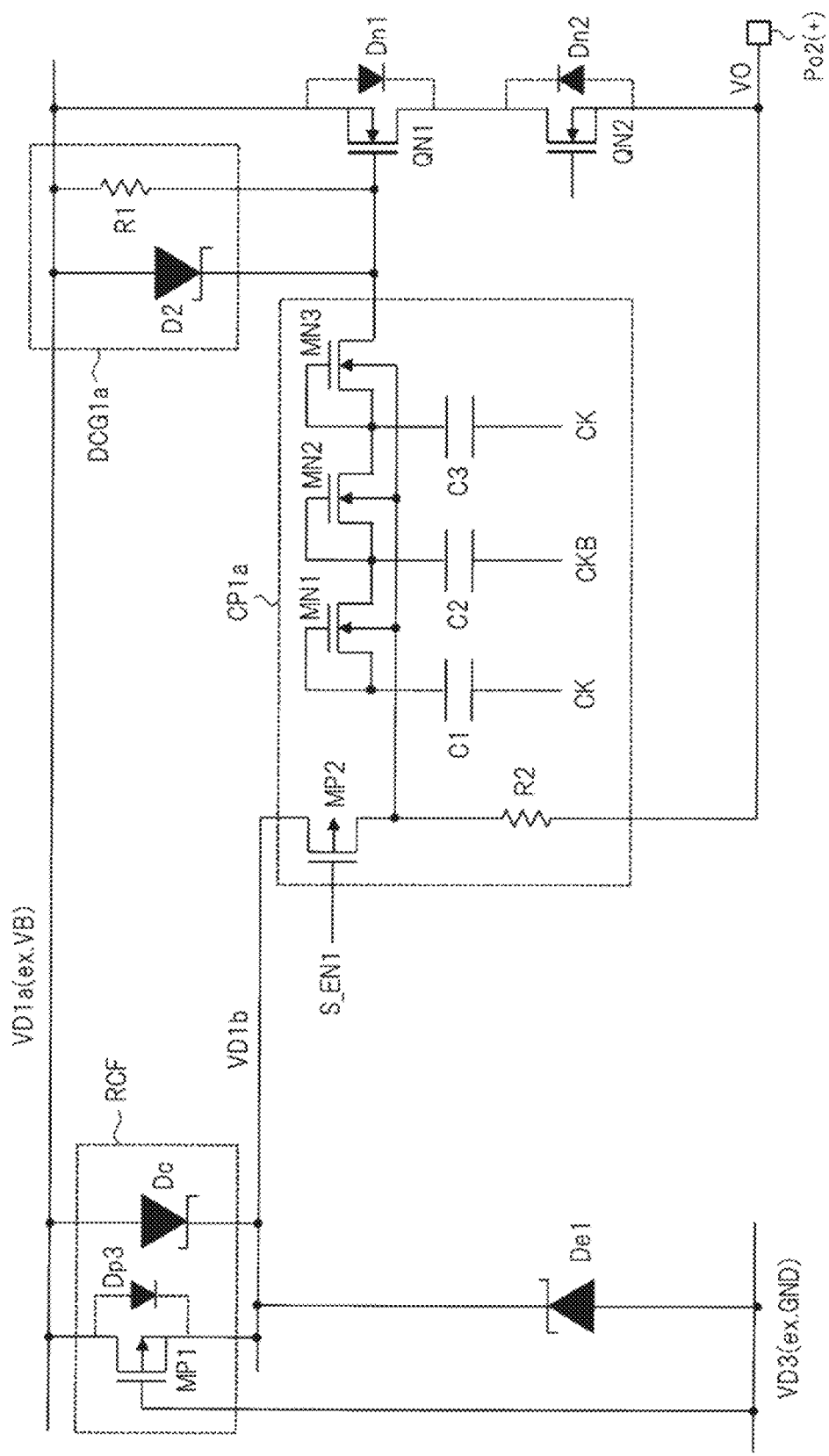
FIG. 4 is a circuit diagram showing a detailed configuration example of the main part in the semiconductor device (relay device) in FIG. 3.
Figure 5:
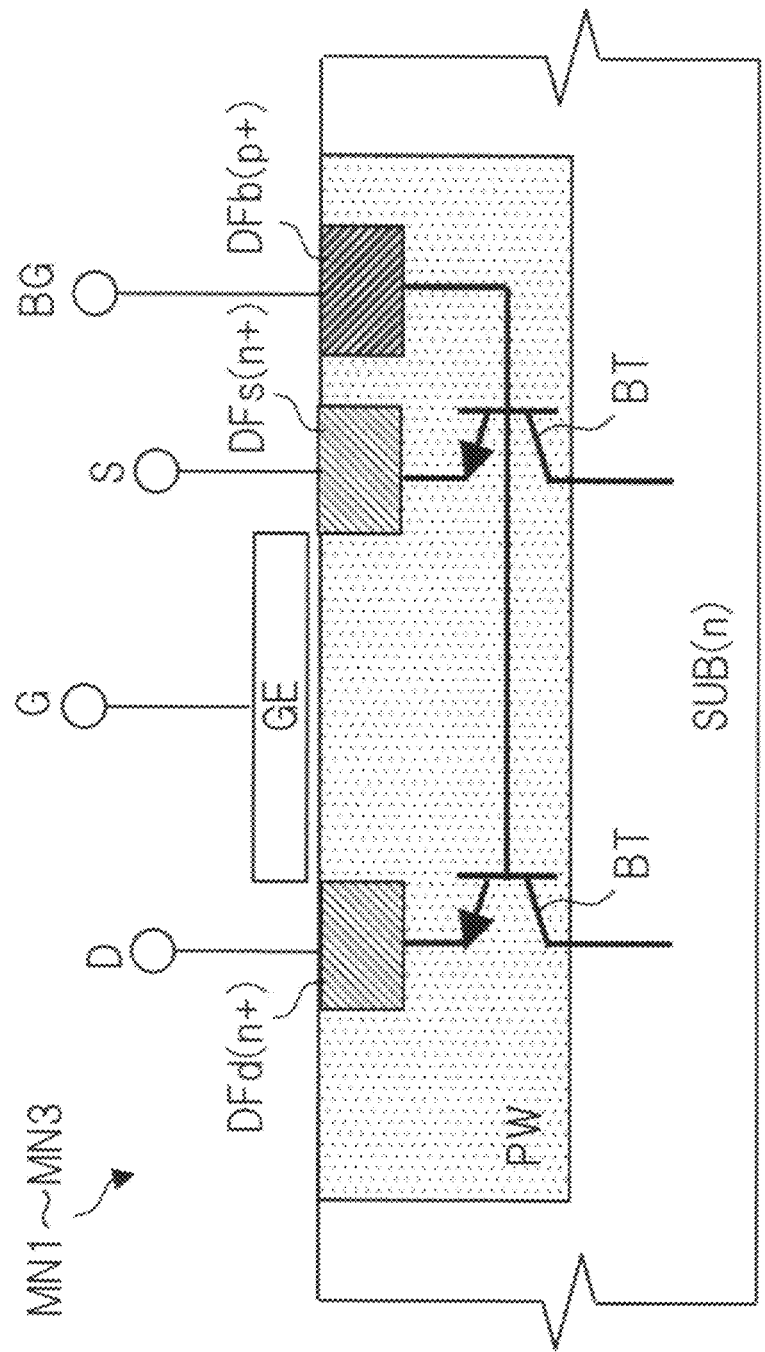
FIG. 5 is a cross-sectional view illustrating a configuration example of each transistor in a pressurization circuit in FIG. 4.

FIG. 4 is a circuit diagram illustrating a detailed configuration example of a main part in the semiconductor device (relay device) of FIG. 3, showing the main part of the relay device (first embodiment). FIG. 5 is a cross-sectional view showing examples of the structures of the transistors in the booster of FIG. 4. FIG. 4 shows a detailed configuration around the backflow preventing circuit RCF, the booster circuit CP1a, and the gate-discharge circuit DCG1a in FIG. 3. The backflow prevention circuit RCF includes a backflow prevention diode Dc and a pMOS transistor MP1 coupled in parallel between the power supply [1a]VD1a and the power supply [1b] VD1b.

Here, when the battery BAT is reversely connected, a current may flow backward from the power supply [3] VD3 to the power supply [1b] VD1b via the forward-biased ESD-protecting diodes De1, and a current may flow backward from the power supply [1b] VD1b to the power supply [1a] VD1a. Therefore, the backflow preventing diodes Dc prevent backflow of current from the power supply [1b] VD1b to the power supply [1a] VD1a. However, in the backflow prevention diode Dc, a forward voltage drop occurs when the battery BAT is connected in the forward direction. Therefore, the gates of the pMOS transistors MP1 are coupled to the power supply [3] VD3, so that they are turned on when the batteries BAT are connected in order, and the power supply potential [1b] VD1b and the power supply potential [1a] VD1a are controlled to have the same potential. When the battery BAT is reversely connected, the pMOS transistor MP1 is turned off, and the parasitic diodes Dp3 of the battery BAT are also reversely biased.

For example, in an in-vehicle system of a 12 V system as shown in FIG. 1, since the rating of the reverse voltage is generally −16 V, the breakdown voltage of the reverse current prevention diode Dc may be 16 V or more, and is designed to be, for example, 20 V or the like. The breakdown voltage of the pMOS transistor MP1 may be greater than or equal to the breakdown voltage of the diode Dc for preventing backflow if only the reverse voltage is taken into account, but it is desirable that the diode Dc be designed to be greater than or equal to 50 V in consideration of dump surges and the like at the time of forward connecting the battery BAT.

The booster circuit (charge pump circuit) CP1a includes a pMOS transistor MP2 and a resistor R2 coupled in series between the power supply [1b] VD1b and the load drive terminal Po2(+)], and nMOS transistors MN1 to MN3 and capacitors C1 to C3 serving as a main body of the booster circuit. A clock signal CK (inverted clock signal CKB) from an oscillation circuit (not shown) is applied to one end of each of the capacitors C1 to C3. The gate discharge circuit DCG1a includes a resistor R1 for discharging the gate charge of the power transistor QN1 to the source, and a protective diode D 2 for protecting the gate of the power transistor QN1.

In such a configuration, first, it is assumed that the battery BAT is connected in the forward direction and the control input signal IN is asserted. In this case, the enable signal S_EN1 is also asserted in response to the assertion of the control input signal IN. The pMOS transistor MP2 is turned on in response to the assertion level of the enable signal S_EN1, and supplies the power supply potential [1b] VD1b to the back gate of the nMOS transistors MN1 to MN3.

Each of the nMOS transistors MN1 to MN3 is formed on an n-type semiconductor substrate SUB as shown in FIG. 5. A p-type well PW is formed on the main surface of the semiconductor substrate SUB. In the p-type well PW, an n type source diffusion layer DFs and a drain diffusion layer DFd serving as a source (S) and a drain (D) and a p type feed diffusion layer DFb serving as a back-gate (BG) are formed. A gate electrode GE serving as a gate (G) is disposed above the source diffusion layer DFs and the drain diffusion layer DFd with a gate insulating film interposed therebetween.

In such a configuration, there is an npn-type parasitic bipolar transistor BT having the source diffusion layer DFs and the drain diffusion layer DFd as emitters, the p-type well PW as bases, and the semiconductor substrate SUBs as collectors. The semiconductor substrate SUB is supplied with a power supply potential [1b] VD1b at a place (not shown). As described above, the parasitic bipolar transistor BT is turned on when the power supply potential [1b] VD1b is supplied to the back-gate BG via the pMOS transistor MP2.

When the parasitic bipolar transistor BT is turned on, the parasitic bipolar transistor BT performs a charge operation on the capacitors C1 to C3 of FIG. 4 by causing a charge current to flow through the source diffusion layer DFs and the drain diffusion layer DFd, and in addition, performs an initial charge on the gates of the power transistors QN1. In this condition, the booster CP1a of FIG. 4 applies the clock signal CK (inverted clock signal CKB) to one end of each of the capacitors C1 to C3 to sequentially pump the capacitor C1 to the capacitor C3, thereby generating a predetermined boosted potential.

On the other hand, in parallel with the gate charging current flowing to the gate of the power transistor QN1 by the charge pumping operation of the booster circuit CP1a, the resistor R1 in the gate discharging circuit DCG1a flows the gate discharging current. Here, the resistor R1 is set to a high resistance value so that the above-mentioned gate discharge current is sufficiently smaller than the gate charge current. As a result, the boosted potential is applied to the gates of the power transistors QN1, and the power transistors QN1 are turned on.

Next, it is assumed that the control input signal IN is negated when the battery BAT is connected in the forward direction. In this case, the enable signal S_EN1 is also negated in response to the negation of the control input signal IN. The pMOS transistor MP2 is turned off in response to a negative gate level of the enable signal S_EN1. As a result, the back-gate potential of the nMOS transistors MN1 to MN3 in the booster circuit CP1a is controlled to the same potential as the output potential VO via the resistor R2.

As a result, the parasitic bipolar transistor BT of the nMOS transistors MN1 to MN3 is turned off, and the application of the clock signal CK stops along with the negation of the control signal IN. As a result, the booster circuit CP1a is deactivated. As a result, the electric charge of the gate of the power transistor QN1 is discharged to the source through the resistor R1 in the gate discharge circuit DCG1a, and the gate potential approaches the power supply potential [1a] VD1a with time. During this discharging, the power transistor QN1 is turned on. However, since the gate discharging circuit DCG2 of FIG. 3 quickly controls the power transistor QN2 to be turned off in response to the negation of the enable signal S_EN2, even if the power transistor QN1 is turned on, the forward current supply from the power supply circuit [1a] VD1a to the load LD is cut off.

Next, it is assumed that the battery BAT is reversely connected. In this instance, the power supply potential [3] VD3 is the battery power supply potential VB, the power supply potential [1a] VD1a is the grounding power supply potential GND, and the power supply potential [1b] VD1b is "VB−VF" (VF is the forward voltage of the ESD-protecting diodes De1). The control circuit CTLa does not operate in this potential relation, and the control circuit outputs the battery power supply potential VB as the enable signal S_EN1. As a result, the pMOS transistor MP2 is turned off, and the back-gate potential of the nMOS transistor MN1-MN3 becomes the same potential (for example, approximately the battery power supply potential VB) as the load-driving terminal Po2(+).

On the other hand, when the battery BAT is reversely connected, the power transistor QN1 is turned off by the resistor R1 in the gate-discharge-circuit DCG1a. In the booster CP1a, although the pumping operation is not performed because the clock signal is not generated due to the reverse connection, the parasitic bipolar transistor BT is turned on in response to the potential from the load driving terminal Po2(+) (for example, the battery power supply potential VB), and the charging operation is performed on the capacitors C 1 to C 3. However, the charge current at this time, in other words, the gate-charge current of the power transistor QN1, can be adjusted by the resistor R2.

Therefore, if the resistance of the resistor R2 is designed to be high so that the gate discharging current by the resistor R1 is sufficiently larger than the gate charging current determined by the resistor R2 and the hfe of the parasitic bipolar transistor BT, the power transistor QN1 is kept off. For example, for hfe=100, the resistance value of the resistor R2 may be designed to be 1000 times the resistance value of the resistor R1 or the like. As another method, diodes for preventing a reverse current from the load driving terminal Po2(+) to the booster circuit CP1a may be separately provided in series with the resistor R2.

Figure 6:
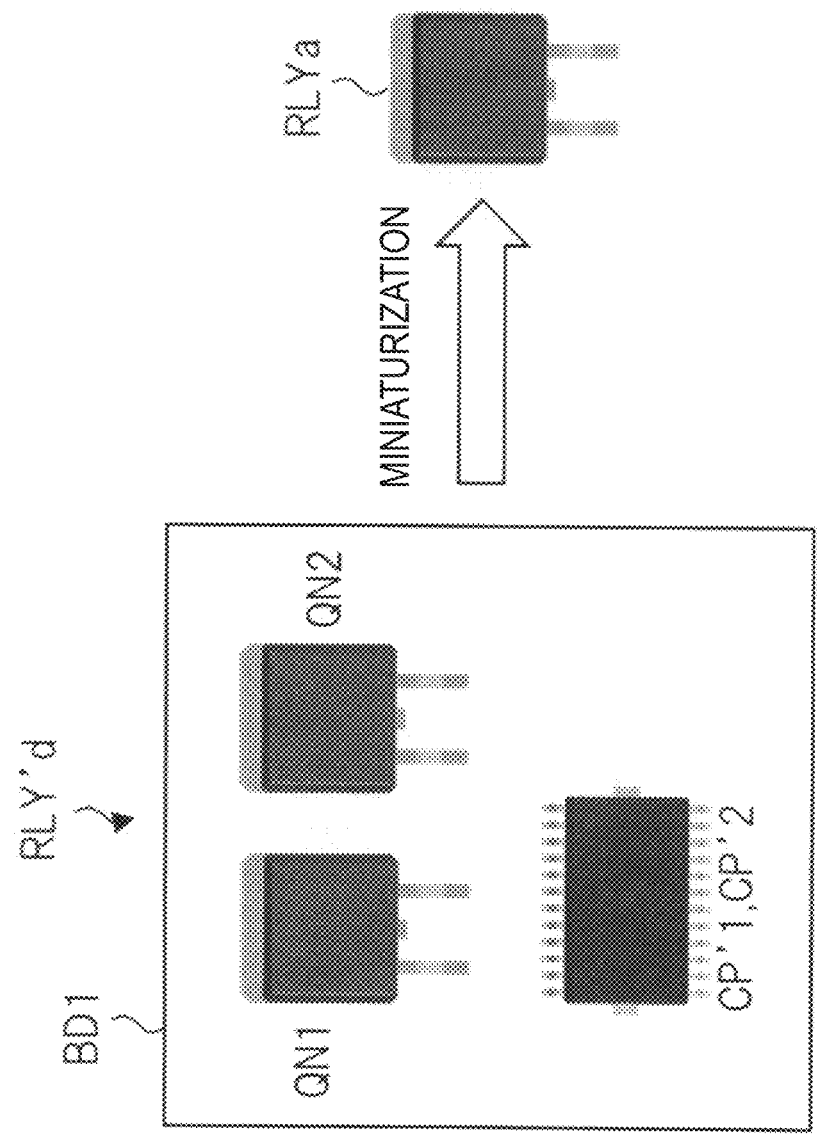
FIG. 6 is a schematic diagram showing the outline of the semiconductor device (relay device) in FIG. 3.

FIG. 6 is a schematic diagram showing an external configuration of the semiconductor device (relay device) of FIG. 3. As shown in FIG. 6, the semiconductor device (relay device) RLYa of FIG. 3 is composed of one semiconductor chip or one semiconductor package. On the other hand, for example, a relay device RLY'd as a second comparative example shown in Patent Document 1 has a configuration in which a plurality of components (two power transistor components (QN1, QN2) and two booster circuit components (CP'1, CP'2)) are mounted on a wiring board BD1, for example.

As described above, when the semiconductor device (relay device) RLYa of FIG. 3 is used, the device can be reduced in size as compared with the relay device RLY'd of the second comparative example. As a result, restrictions on the location where the relaying device is installed are relaxed, and the wiring route of the wiring harnesses can be simplified in the vehicle as shown in FIG. 1. This simplification of the wiring harness contributes to reduction in weight, cost, power consumption, and the like of the vehicle.

In the first embodiment, when the control input signal IN is asserted at the time of forward connection of the battery BAT, the booster circuit CP1a is active in both the charging operation and the pumping operation, and the power transistor QN1 is turned on by the "gate charging current of the booster circuit CP1a ">" gate discharging current of the gate discharging circuit DCG1a. When the battery BAT is forward connected and the control input signal IN is a negative input signal, the booster circuit CP1a is inactive, and the power transistor QN1 is turned off after a predetermined period of time has elapsed due to the gate discharge current of the gate discharge circuit DCG1a. On the other hand, when the battery BAT is reversely connected, the booster circuit CP1a is activated with a weak charge operation, and the power transistor QN1 is turned off by the "gate charge current of the booster circuit CP1a "<" gate discharge current of the gate discharge circuit DCG1a.

By providing the gate discharging circuit DCG1a between the gate and the source of the power transistor QN1 in this manner, the reverse current supply from the load LD to the power supply can be cut off. Further, by assuming that the power transistors QN1 and QN2 of the n-channel type two-stage configuration is used, it is possible to realize low-loss or miniaturization of the relay device RLYa. Further, by realizing the relay device RLYa with one semiconductor package (IPD), further miniaturization of the device can be realized. Here, although the resistor R1 is provided in the gate discharge circuit DCG1a, a nMOS transistor may be provided instead of the resistor R1. The gates of the nMOS transistors are then coupled to the power supply [3] VD3.

Second Embodiment

A relay device RLY for automobiles as shown in FIGS. 1 and 2, for example, the power supply shown [1a] VD1a in FIG. 3 is typically coupled to battery power supply VB. In this instance, various external surges may be applied to the power supply [1a] VD1a. Here, when a positive-polarity surge typified by a dump surge caused by an alternator occurs, it is difficult for an excessive power to be applied to the power transistor QN1 shown in FIG. 3. This is because the parasitic diodes Dn1 are energized even when the power transistor QN1 is off. On the other hand, when negative-polarity surges due to field coils or inductive loads occur, the power transistor QN1 may consume excessive power due to breakdown when the field coils or inductive loads are turned off, resulting in breakdown.

Figure 7:
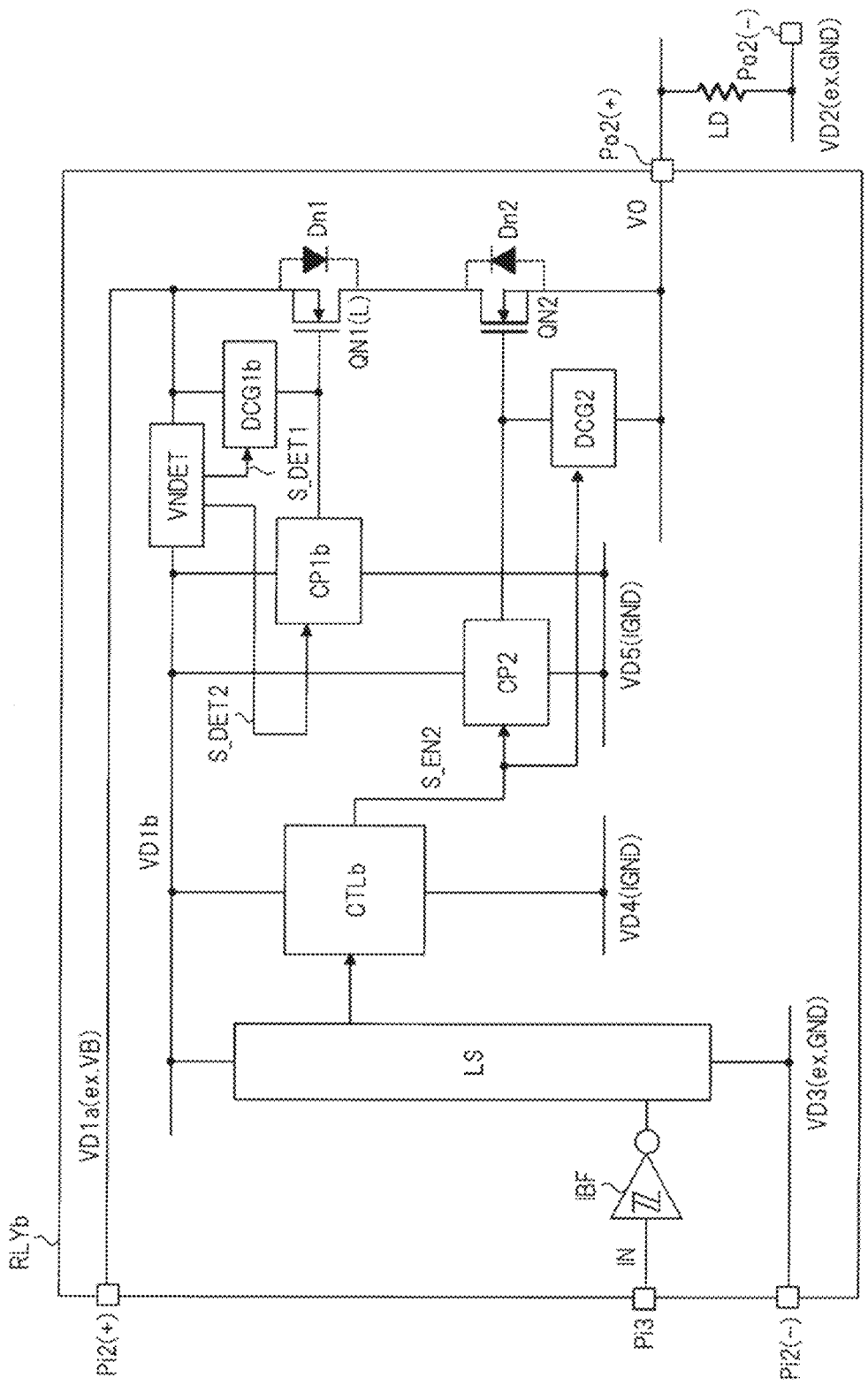
FIG. 7 is a block diagram showing a schematic configuration example of a semiconductor device (relay device) according to the second embodiment.

FIG. 7 is a block diagram showing a schematic configuration of a semiconductor device (relay device) according to the second embodiment. The semiconductor device (relay device) RLYb shown in FIG. 7 differs from the configuration shown in FIG. 3 in the following five points. As a first difference, a power transistor QN1 (L) is provided instead of the power transistor QN1 shown in FIG. 3. The power transistor QN1(L) has a lower withstand voltage than the power transistor QN1 and the power transistor QN2. As a specific example, the withstand voltage of the power transistor QN2 (and the power transistor QN1) is 40 V or the like, whereas the withstand voltage of the power transistor QN1 (L) is 20 V or the like.

Figure 9:
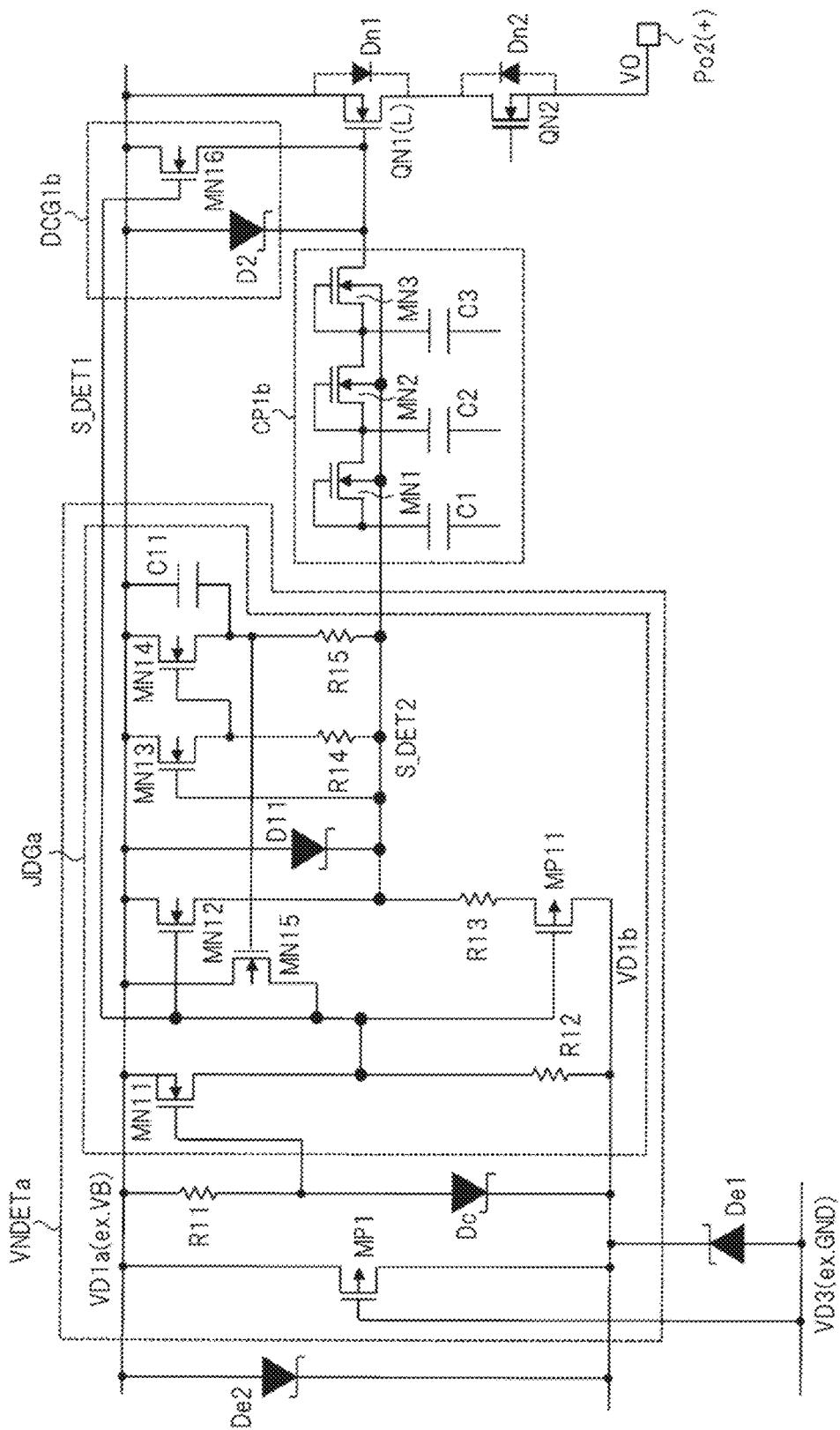
FIG. 9 is a circuit diagram illustrating a detailed configuration example of a main part in the semiconductor device (relay device) in FIG. 7.

As a second difference, the gate discharge circuit DCG1*b* includes a short-circuit transistor MN16 instead of the resistor R1 in FIG. 4, as shown in detail in FIG. 9. As a third difference, the booster circuit CP1*b* is composed of the booster circuit body (MN1 to MN3, C1 to C3) shown in FIG. 4. As a fourth difference, a negative potential detecting circuit VNDET is provided instead of the backflow preventing circuit RCF shown in FIG. 3. The negative potential detection circuit VNDET controls the short-circuit transistor in the gate-discharge circuit DCG1*b* by the negative potential detection signal [1] S_DET 1, and controls the booster circuit CP1*b* by the negative potential detection signal [1] S_DET 2. Accordingly, as a fifth difference, the control circuit CTLb does not output the enable signal S_EN1 shown in FIG. 3.

In an in-vehicle system of a 12 V system as shown in FIGS. 1 and 2, generally, the DC rating of the positive polarity is required to be 28 V in consideration of erroneous connection at the time of jump start or the like. On the other hand, the DC rating of negative polarity, which is not assumed to be a situation such as jump start, is generally −16 V. Focusing on such a rated potential difference between the positive polarity and the negative polarity, the power transistor QN1(L) can be realized with a low withstand voltage configuration. As a specific structural example, for example, Japanese unexamined Patent Application publication No. 2016-207716 and the like can be cited. By using such a configuration, the on-resistance of the power transistor QN1 (L) can be reduced, and the device can be further reduced in losses or miniaturization, as compared with the configuration of FIG. 3.

However, when negative surges such as −60 V to −120 V are applied to the power supply [1*a*] VD1*a*, the losses due to breakdown of the power transistor QN1(L) increase by the amount corresponding to the low withstand voltage. Therefore, for example, when a method as disclosed in Patent Document 2 is used, the power transistor can be controlled to be on when a negative surge is applied, so that such a loss can be reduced and the power transistor can be protected. However, in the method of Patent Document 2, since a large capacitor is required according to, for example, the duration of the negative surge, it may be difficult to construct a relay device in one semiconductor chip or one semiconductor package. Therefore, in FIG. 7, negative potential detecting circuits VNDET and the like are provided.

Figure 8:
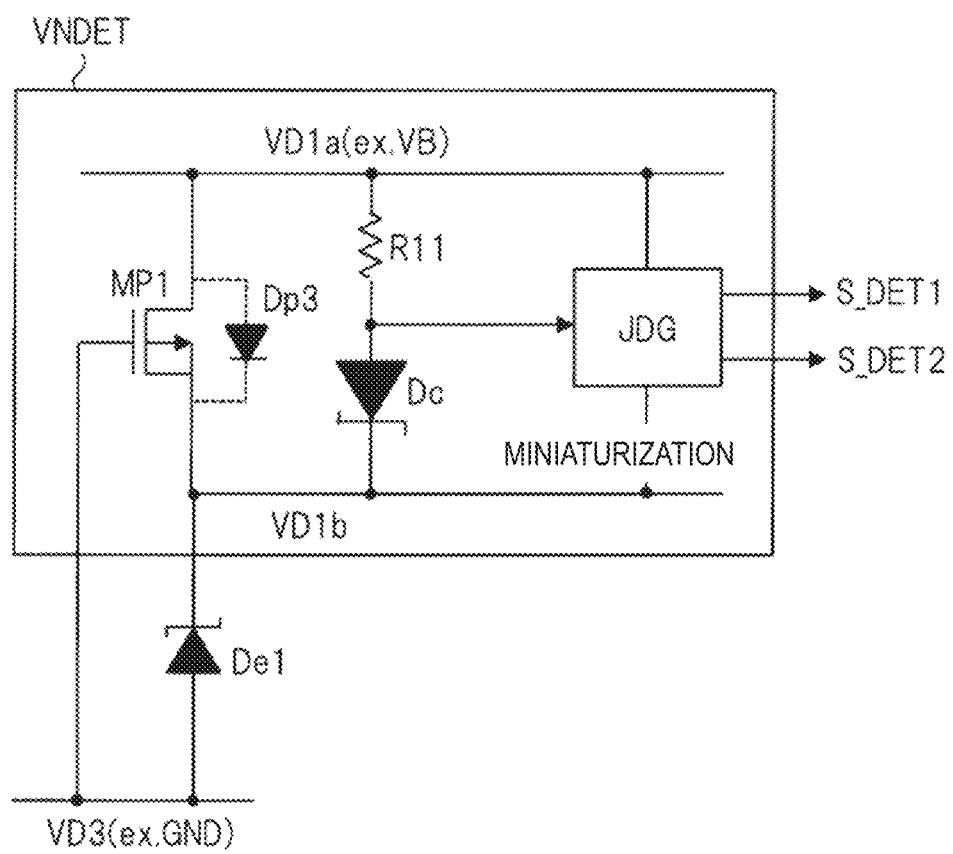
FIG. 8 is a circuit diagram showing a schematic configuration of a negative potential detecting circuit in the semiconductor device (relaying device) in FIG. 7.

FIG. 8 is a circuit diagram illustrating a schematic configuration example of a negative potential detecting circuit in the semiconductor device (relay device) of FIG. 7, in which the main part of the relay device (second embodiment) is detailed. FIG. 9 is a circuit diagram showing a detailed configuration of a main part of the semiconductor device (relay device) of FIG. 7. For example, in FIG. 7, both when the battery BAT is reversely connected and when negative surges are applied to the power supply [1*a*]VD1*a*], a negative potential is applied to the power supply [1*a*] VD1*a* with reference to the power supply [3] VD3. However, it is desired that the power transistor QN1(L) is turned off when the battery BAT is reversely connected, and is turned on when negative surges are applied to the battery BAT. Therefore, negative potential detecting circuits VNDET are provided to distinguish between the reverse connection of the battery BAT and the application of negative surges, and to switch on/off of the power transistor QN1(L) in accordance with the result of the distinguishing between the reverse connection of the battery BAT and the application of negative surges.

The negative potential detecting circuit VNDET shown in FIG. 8 includes a resistor R11 and a negative potential discriminating circuit JDG in addition to the pMOS transistor MP1 and the reverse current preventing diode Dc in the reverse current preventing circuit RCF shown in FIG. 4. The resistor R11 and the backflow preventing diode (Zener diode) Dc are provided in series between the power supply [1*a*] VD1*a* (in other words, the positive power supply terminal Pi2(+)) and the power supply [1*b*] VD1*b*. Here, when the battery BAT is reversely connected or when negative surges are applied to the battery BAT, the power supply [1*b*] VD1*b* is coupled to the power supply [3] VD3 (in other words, the negative power supply terminal Pi2(−)) via the forward-biased ESD-protecting diodes Del. Therefore, the resistor R11 and the backflow preventing diode Dc are substantially provided in series between the positive power supply terminal Pi2(+) and the negative power supply terminal Pi2(−).

The breakdown voltage of the reverse current prevention diode Dc is 16 V or more, and is set to, for example, 20 V or the like. When the battery BAT is reversely connected (for example, when −12 V or the like is applied to the power supply [1*a*] VD1*a*), the backflow preventing diodes Dc do not break down, so that a predetermined potential difference does not occur between both ends of the resistor R11. On the other hand, when a negative surge exceeding the breakdown voltage of the backflow prevention diode Dc (for example, a negative surge on the negative side of −20 V) is applied to the power supply [1*a*] VD1*a*, the backflow prevention diode Dc breaks down, so that a predetermined potential difference is generated between both ends of the resistor R11. The negative potential determination circuit JDG determines whether the battery BAT is connected in the reverse direction or when a negative surge is applied, based on the presence or absence of a predetermined potential difference in the resistor R11, that is, the presence or absence of breakdown of the reverse current prevention diode Dc.

As will be described in detail with reference to FIG. 9, the negative potential determination circuit JDG controls the gate-discharge circuit DCG1*b* to be turned on via the negative potential detection signal [1] S_DET1 and deactivates the booster circuit CP1*b* via the negative potential detection signal [2] S_DET2 when the battery BAT is reversely connected. As a result, the power transistor QN1(L) is turned off to cut off the reverse conduction. On the other hand, when negative surges are applied, the negative potential determination circuit JDG controls the gate-discharge circuit DCG1*b* to be turned off via the negative potential detection signal [1] S_DET1, and causes the booster circuit CP1*b* to output a predetermined potential that is more positive than the power supply potential [1*a*] VD1*a* via the negative potential detection signal [2] S_DET2. As a result, the power transistor QN1(L) is turned on, and power losses due to negative surges can be reduced.

On the other hand, when the battery BAT is connected in order, the power supply [1*a*] VD1*a* and the power supply [1*b*] VD1*b* have substantially the same potential via the pMOS transistor MP1. In this instance, the negative potential determination circuit JDG controls the gate-discharge circuit DCG1b to be off via the negative potential detection signal [1]S_DET1, and activates the booster circuit CP1b via the negative potential detection signal [2] S_DET2, thereby controlling the power transistor QN1(L) to be on.

As described above, the negative potential detecting circuit VNDET determines whether the negative potential applied to the power supply [1a] VD1a (positive power supply terminal Pi2(+)] is on the positive side or the negative side with respect to the power supply [3] VD3 (negative power supply terminal Pi2(-)) as a reference, is higher than a predetermined negative threshold potential (i.e., –20 V or the like based on the breakdown voltage of the reverse current preventing diode Dc). Then, the negative potential detecting circuit VNDET controls the gate discharge circuit DCG1b to be on in the case of the positive side (e.g., –12 V associated with the reverse connection of the battery BAT, etc.), and controls the gate discharge circuit DCG1b to be off in the case of the negative side (e.g., –100 V associated with the negative surge, etc.).

FIG. 9 shows examples of configurations around the negative potential detecting circuit VNDET shown in FIGS. 7 and 8, around the booster circuit CP1b, and around the gate discharge circuit DCG1b. The gate discharging circuit DCG1b comprises a power supply [a protective diode D 2 and a nMOS transistor (shorting transistor) MN16 coupled in parallel between the power supply [1a] VD1a and the gate of the power transistor QN1(L). The booster CP1b includes the same nMOS transistors MN1 to MN3 and capacitors C1 to C3 as in FIG. 4.

The negative potential detecting circuit VNDETa (VNDET) includes a negative potential determining circuit JDGa. The negative potential discriminating circuit JDGa includes a nMOS transistors MN11 to MN15, resistors R12 to R15, a pMOS transistor MP11, a diode D11, and a capacitor C11. The negative potential detecting signal [1] S_DET1 from the negative potential determining circuit JDGa is applied to the gate of the nMOS transistor (shorting transistor) MN16 in the gate discharging circuit DCG1b.

The negative potential detecting signal [2] S_DET2 from the negative potential determining circuit JDGa is applied to the back gate of the nMOS transistors MN1 to MN3 in the booster circuit CP1b. The diode (Zener diode) D11 is coupled between the power supply [1a] VD1a (in other words, the positive power supply terminal Pi2(+)]) and the back gate of the nMOS transistor MN1 to MN3 as a power supply [1a] VD1a as anodeside (cathode on the back gate side).

In FIG. 9, the power supply [3] VD3 is coupled to the ground power supply potential GND of the battery BAT, in particular, is coupled to the ground power supply potential GND via an external resistor, such as 100Ω. The breakdown voltage of the backflow preventing diode Dc in the negative potential detecting circuit VNDETa is, for example, 20 V or the like, which is approximately the same as the breakdown voltage of the power transistor QN1(L). As described above, from the viewpoint of protecting the power transistor QN1(L), the breakdown voltage of the backflow preventing diode Dc is desirably set to be equal to or lower than the breakdown voltage of the power transistor QN1(L) (however, higher than the battery power supply potential VB).

In such a configuration, first, it is assumed that the batteries BAT are connected in order. In this instance, since the power supply [1b] VD1b becomes substantially the same potential as the power supply [1a] VD1a by the pMOS transistor MP1, the negative potential discrimination circuit JDGa does not perform the discrimination operation. The negative potential determination circuit JDGa controls the nMOS transistor MN16 in the gate-discharge circuit DCG1b to be turned off by controlling the negative potential detecting signal [1] S_DET1 to be substantially the power supply potential [1a] VD1a via the resistor R12. The negative potential determination circuit JDGa supplies the power supply potential [1a] VD1a to the back-gate of the nMOS transistors MN1 to MN3 in the booster circuit CP1b via the diode D11. As a result, the booster CP1b performs a charging operation and a pumping operation based on clock signals (not shown) to boost the gate potential of the power transistor QN1(L) to a potential at which the power transistor QN1(L) can operate in a sufficiently linear range.

Next, it is assumed that the battery BAT is reversely connected. In this case, since the backflow prevention diode Dc does not break down, a potential difference does not occur between both ends of the resistor R11. Therefore, the nMOS transistor MN11 is turned off, and the power supply potential [1b] VD1b (i.e., approximately the battery power supply potential VB) is transmitted through the resistor R12, so that the nMOS transistor MN12 is turned on and the pMOS transistor MP11 is turned off. As a result, the negative potential detection signal [1] S_DET 1 becomes the same potential as the power supply [1b] VD1b (approximately the battery power supply potential VB), and the negative potential detection signal [2] S_DET2 becomes the same potential as the power supply [1a] VD1a (i.e., the grounding power supply potential GND).

The nMOS transistor MN16 in the gate-discharge-circuit DCG1b is turned on in response to the negative potential detecting signal [1] S_DET1. In the booster circuit CP1b, the parasitic bipolar transistor BT in FIG. 5 is turned off in response to the negative potential detecting signal [2] S_DET2, and the oscillator circuit does not operate, so that the pumping operation is not performed. Therefore, the booster CP1b is deactivated. As a result, the power transistor QN1(L) is turned off to cut off the reverse conduction.

Next, it is assumed that a negative surge (e.g., –60 V to –120 V) is applied to the power supply [1a] VD1a when the battery BAT is connected in order. Since the potential relation between the power supply [1a] VD1a and the power supply [3] VD3 is the same as that at the time of reverse connection of the battery BAT described above, the power transistor QN1(L) is turned off by turning on the nMOS transistor MN16 unless the reverse connection of the battery BAT and the negative surge application are distinguished.

However, when negative surges are applied, it is desired that the power transistor QN1(L) is turned on. Here, when the control input signal IN shown in FIG. 7 is at the asserted level, the power transistor QN1(L) is originally turned on, so that no particular problems occur even if negative surges are applied to the control input signal IN. On the other hand, when the control input signal IN is at the negate level (i.e., when the booster circuit CP1b is initially inactive), the control input signal IN needs to be devised to turn on the power transistor QN1(L) unlike when the battery BAT is reversely connected to the booster circuit QN1.

When a negative surge is applied to the power supply [1a] VD1a, the reverse current preventing diode Dc breaks down via the ESD-protecting diode Del, and a potential difference is generated between both ends of the resistor R11. The power supply [1b] VD1b becomes a potential lower than the power supply [3] VD3 by the forward voltage of the ESD-protecting diode Del, and becomes higher than the power supply potential [1a] VD1a. As a result, the nMOS transistor MN11 is turned on, and the negative potential detecting signal [1] S_DET 1 becomes the same potential as the power supply signal [1a] VD1a. As a result, the nMOS transistor MN16 in the gate discharge circuit DCG1b is turned off.

In addition, the pMOS transistor MP11 is turned on and the nMOS transistor MN12 is turned off in response to the turning on of the nMOS transistor MN11. As a result, a current flows from the pMOS transistor MP11 through the resistor R13 and the diode D11. As a result, the negative potential detecting signal [2] S_DET 2 becomes a potential that becomes positive by the breakdown voltage (for example, 6 V) of the diode (Zener diode) D11 with reference to the power supply potential [1a] VD1a.

In the booster CP1b, the parasitic bipolar transistor BT is turned on in response to the negative potential detecting signal [2] S_DET2, and performs a charge operation. In the booster circuit CP1b, since the pumping operation is not performed in accordance with the negation of the control input signal IN, only the charging operation of the booster circuit CP1b is activated. As a result, an on-voltage determined by the breakdown voltage of the diode (Zener diode) D11 can be applied between the gate and the source of the power transistor QN1(L). At this time, the nMOS transistor MN16 is off. As a result, the power transistor QN1(L) can be controlled to be turned on when negative surges are applied. As described above, the breakdown voltages of the diodes D11 need only be values at which the power transistor QN1(L) can operate in a sufficiently linear range.

Here, the base current of the parasitic bipolar transistor (BT in FIG. 5) in the booster CP1b can be adjusted by the resistor R13, and the on-speed of the power transistor QN1(L) can be determined by the resistor R13. For example, if it is desired to turn on rapidly, the resistor R13 may be set to a small resistance value. Here, a nMOS transistor MN16 is provided in the gate discharge circuit DCG1b. On the other hand, it is not easy to use a pMOS transistor instead of the nMOS transistor. That is, in order to discharge the gate potential of the power transistor QN1(L) to the ground power supply potential GND while the power supply [1a] VD1a is at the ground power supply potential GND when the battery BAT is reversely connected, a negative potential needs to be applied to the gate of the pMOS transistor.

In order to prevent chattering in the vicinity of the breakdown voltage of the reverse current prevention diode Dc, it is desirable that the negative potential detection signal [1]S_DET1 and the negative potential detection signal [2] S_DET2 are latched in a state when a negative surge is applied. The nMOS transistors MN13 to MN15, the resistors R14 and R15, and the capacitor C11 are provided as elements for latching. When the power supply potential [1a] VD1a returns to the positive electrode, the latch is released because the potential difference between the power supply potential [1a] VD1a and the power supply potential [1b] VD1b becomes small.

As described above, by rapidly turning on the power transistor QN1(L) when negative surges are applied, losses of the power transistor QN1(L) can be greatly reduced as compared with when breakdown is performed, and a low withstand voltage configuration can be applied to the power transistor QN1(L). Further, the power transistor QN1(L) can be protected. Specific examples of the loss are shown below.

Assuming that the breakdown voltage of the power transistor QN1(L) is "BV1", the on-resistance is "Ron1", the negative surge potential is "Vsr", and the load resistance is "RL", the loss PL1 in the case of breakdown is expressed by Equation (1), and the loss PL2 in the case of turning on is expressed by Equation (2). For example, when Vsr=−100V, BV1=20V, Ron1=5 mΩ, RL=1Ω, the PL1 is 1600 W, whereas the PL2 is 50 W.

$$PL1 = BV1 \times (|Vsr| - BV1)/RL \tag{1}$$

$$PL2 = Ron \times (|Vsr|/RL)2 \tag{2}$$

Figure 10:
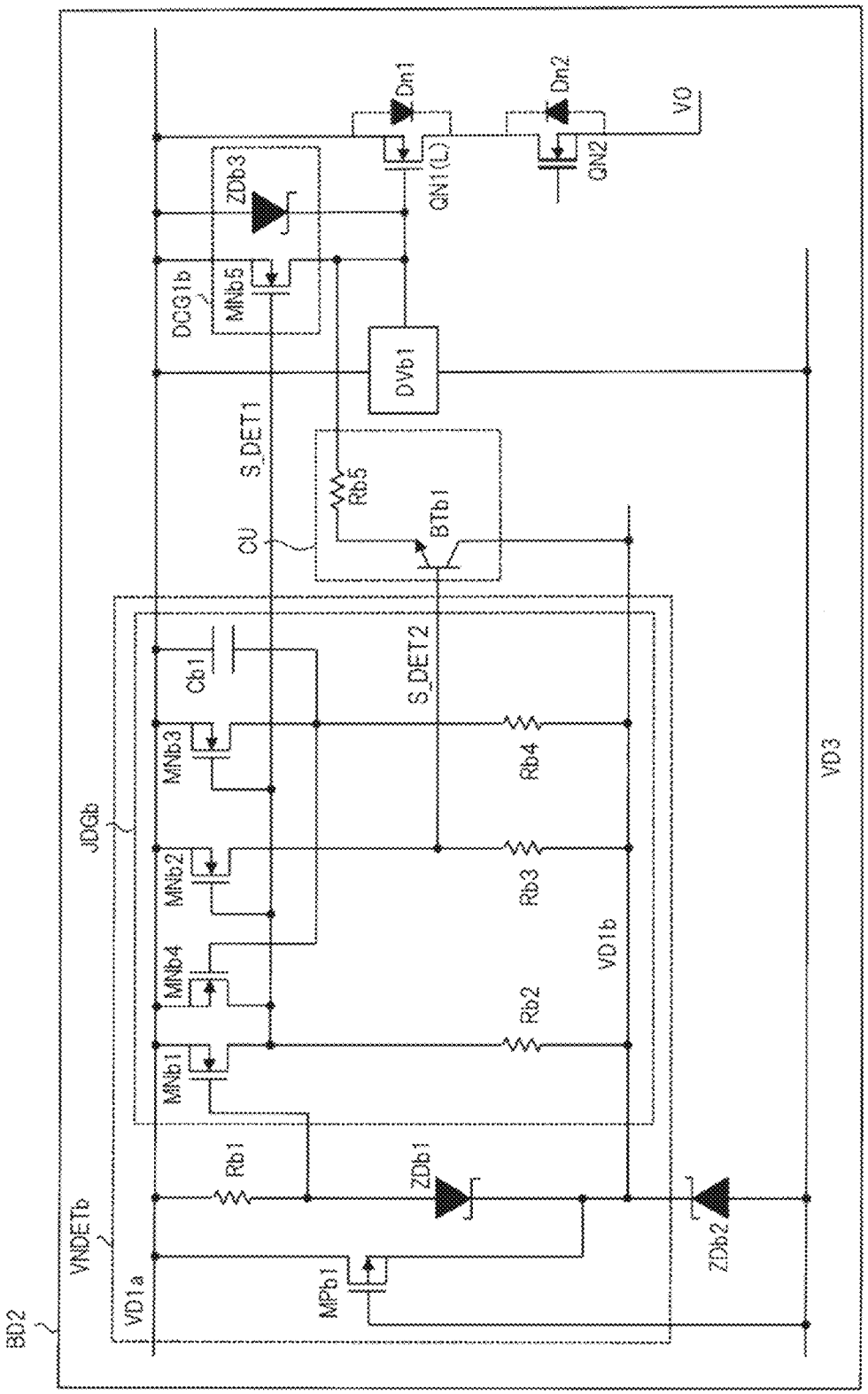
FIG. 10 is a circuit diagram showing a configuration example when the circuit in FIG. 9 is formed on a wiring substrate.
Figure 11:
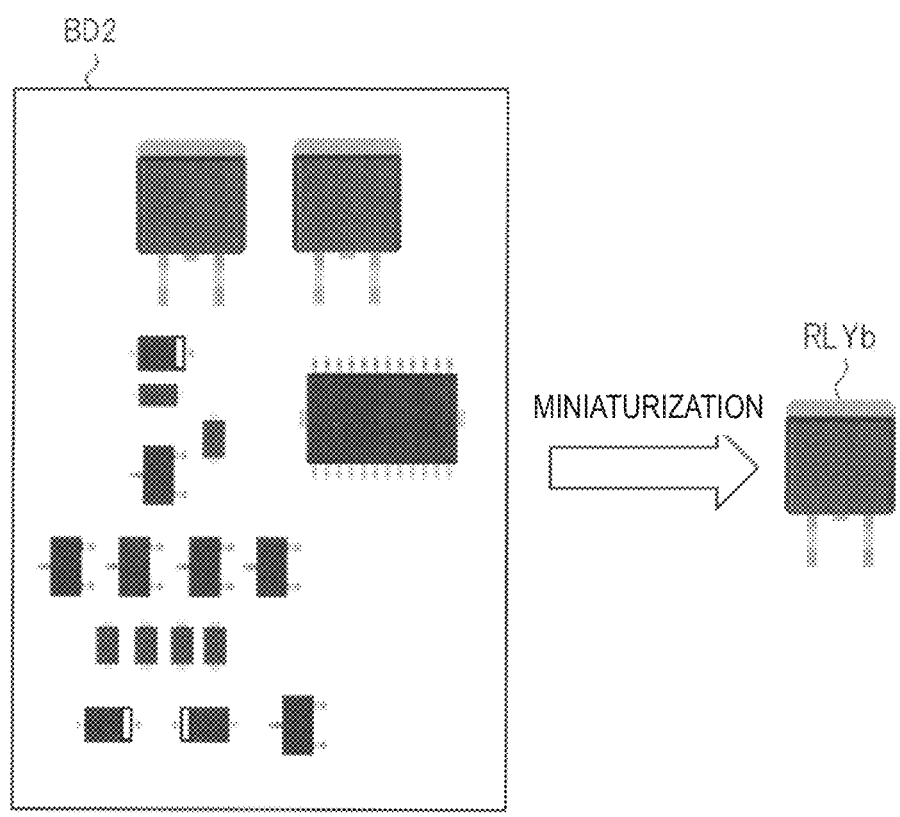
FIG. 11 is a schematic diagram comparing the relay device in FIG. 7 with the relay device according to FIG. 10.

FIG. 10 is a circuit diagram showing a configuration example when the circuit of FIG. 9 is formed on a wiring substrate. As shown in FIG. 10, the circuit of FIG. 9 can be realized by mounting a plurality of components on the circuit board BD2. In FIG. 10, the charge circuit CU is a circuit corresponding to the parasitic bipolar transistor BT of FIG. 5 when the negative surge is applied, and the booster circuit CU is mounted in the driver DVb1. FIG. 11 is a schematic diagram comparing the outline examples of the relay device of FIG. 7 and the relay device according to FIG. 10.

As shown in FIG. 11, in the relay device (printed circuit board BD2) according to FIG. 10, the number of components is greatly increased as compared with the relay device RLYb of FIG. 7, so that it is difficult to miniaturize the device. Further, the gate oxide film breakdown voltage of the pMOS transistor MPb1 in FIG. 10 needs to be 40 V or more in view of dump surge, but since a typical gate oxide film breakdown voltage is 20 V, the breakdown voltage of the zener diode ZDb2 needs to be set to 20 V or less. If the battery power supply potential VB is set to about 8 V to 16 V and the temperature characteristics are taken into consideration, the breakdown voltage of the Zener diode ZDb2 needs to be within the range of 16 V to 20 V, which may make it difficult to select a component.

In the second embodiment, when the control input signal IN is asserted while the battery BAT is connected in order, both the charging operation and the pumping operation of the booster circuit CP1b are activated. The nMOS transistor MN16 in the gate discharging circuit DCG1b is turned off because the source is coupled to the power supply [1a] VD1a, the gate is coupled to the power supply [1a] VD1a via the pMOS transistor MP1 and the resistor R12, and the boosted potential is applied to the drain. As a result, the power transistor QN1(L) is turned on. On the other hand, when the control input signal IN is negated, the nMOS transistor MN16 is turned off during a period in which the boosted potential remains at the drain, and the power transistor QN1(L) is turned on during the period. However, the power transistor QN2 is off.

When the battery BAT is reversely connected, the booster CP1b is inactive, and the nMOS transistor MN16 is turned on because its source is coupled to the power supply [1a] VD1a and its gate is coupled to the power supply [3] VD3 via the ESD-protecting diode Del and the resistor R12. As a result, the power transistor QN1(L) is turned off. Further, when the battery BAT is connected in the forward direction, when the control input signal IN is negated, and when a negative surge is applied to the control input signal IN, the booster circuit CP1b is activated in the charge operation of the booster circuit CP1b. The nMOS transistor MN16 is turned off because its source is coupled to the power supply [1a] VD1a and its gate is also coupled to the power supply [1a] VD1a via the nMOS transistor MN11. As a result, the power transistor QN1(L) is turned on.

By using such a method, the same effects as those of first embodiment can be obtained. Further, by configuring the power transistor QN1(L) so that it can be driven on at the time of negative surge application, losses at the time of negative surge application can be reduced, and a structure having a lower withstand voltage than the structure of the power transistor QN2 can be applied to the power transistor QN1(L). As a result, further reduction in losses or miniaturization of the relaying device can be realized.

Third Embodiment

As described above, the gate potential of the nMOS transistor MN16 in the gate discharge circuit DCG1b illustrated in FIG. 9 is controlled by the negative potential detecting signal [1] S_DET1, as a prerequisite to the third embodiment. When the battery BAT is forward-connected, the negative potential detecting signal [1] S_DET1 becomes substantially the same potential as the power supply signal [1a] VD1a. Therefore, the nMOS transistor MN16 is turned off, and the gate charge of the power transistor QN1(L) is not discharged. That is, the power transistor QN1(L) cannot be controlled to be turned off.

On the other hand, the power supply to the load LD is controlled by the power transistor QN2, and the power transistor QN2 is quickly turned on and off in response to the control input signal IN. For this reason, by controlling the power transistor QN2 to be off regardless of the status of the power transistor QN1(L), it is possible to cut off the forward current supply to the loads LDs.

For this reason, although a fatal problem does not occur because the power transistor QN1(L) cannot be controlled to be turned off, a problem may occur when capacitor loads or the like are used. For example, when the capacitor load is used and cranking occurs at the time of negation of the control input signal IN, since the potential of the capacitor load>the power supply potential [1a] VD1a, the charge of the capacitor load may escape to the power supply [1a] VD1a, and may not be recovered thereafter.

Figure 12:
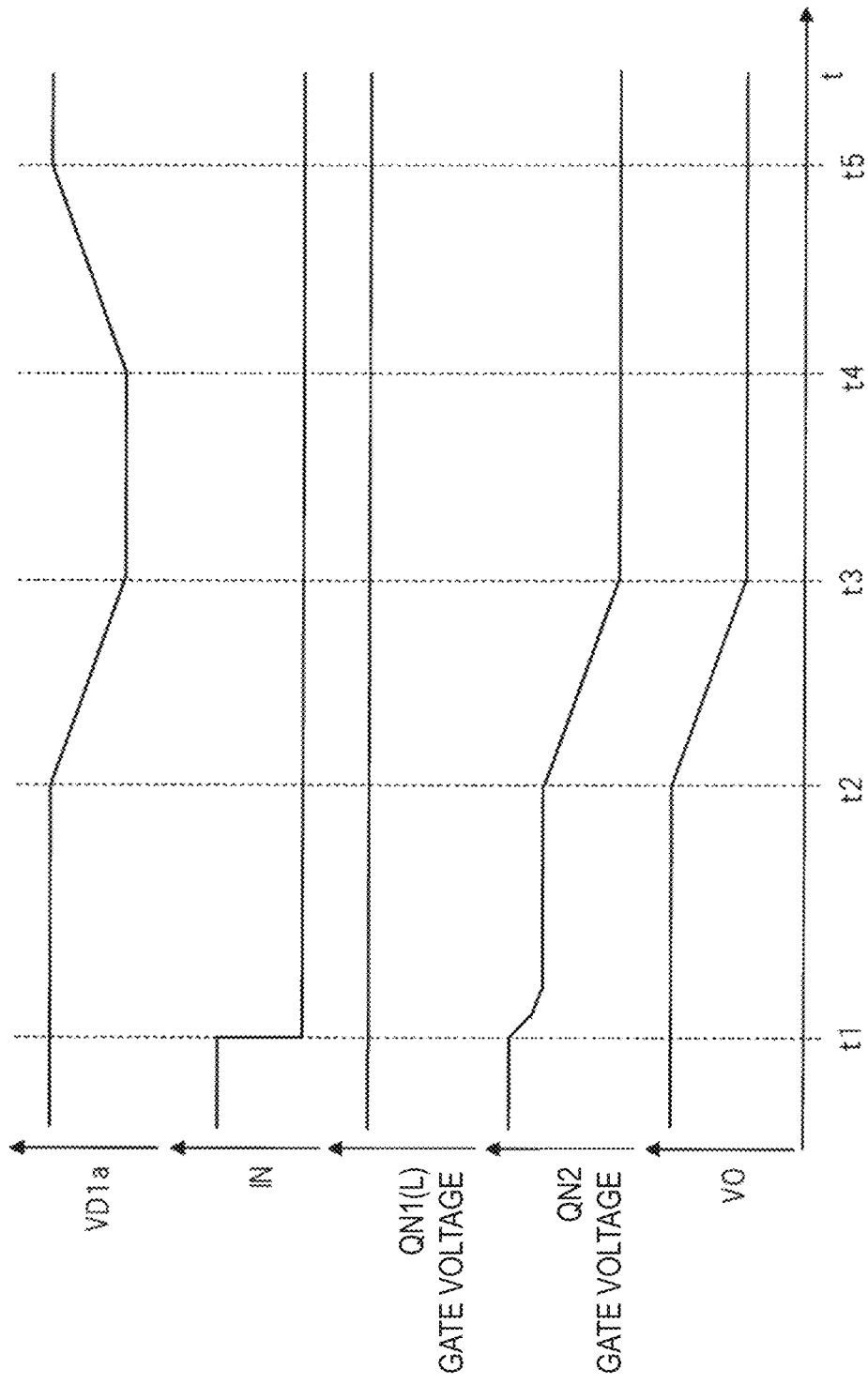
FIG. 12 is a waveform diagram illustrating an example of a prerequisite issue in a semiconductor device (relay device) according to the third embodiment.

FIG. 12 is a waveform diagram showing an exemplary problem that is a prerequisite in a relay device (semiconductor device) according to the third embodiment. FIG. 12 shows changes in the power supply potential [1a] VD1a, the gate potentials of the power transistors QN1(L) and QN2, and the potential of the output potential VO when the control input signal IN is negated at time t1 and cranking occurs between times t2 and t5.

When the control input signal IN is negated at time t1, the gate potential of the power transistor QN2 is lowered by the gate discharging circuit DCG2 until the gate potential of the control input signal IN becomes equal to the output potential VO of the load driving terminal Po2(+). On the other hand, since the nMOS transistor MN16 in the gate discharging circuit DCG1b is not turned on, the gate potential of the power transistor QN1(L) is maintained at a potential at which the power transistor QN1(L) can be turned on. Strictly speaking, the gate potential of the power transistor QN1(L) decreases to the power supply potential [1a] VD1a in the long term due to the leakage current of the respective elements coupled to the gate, but in FIG. 12, it is assumed that the leakage current is not present.

When cranking occurs at the time t2 and the power supply potential [1a] VD1a drops, the electric charge of the capacitor load coupled to the load driving terminal Po2(+) escapes to the power supply [1a] VD1a via the parasitic diodes Dn2 of the power transistor QN2 and the channels of the power transistor QN1(L). During the period from time t4 to time t5, the power supply potential [1a] VD1a returns to the original potential. However, since the power transistor QN2 is off, the potential of the capacitor load (output potential VO) is maintained at the potential dropped during the period from time t3 to time t4 without re-supplying the discharged electric charges.

A capacitor load may be used, for example, when a unit having a capacitor load as a back-up power source is present downstream of the relay device. In this case, for example, a risk may arise that the downstream unit is shut off by a low voltage. Therefore, it is advantageous to use a relay device (semiconductor device) of third embodiment, which will be described later.

Figure 13:
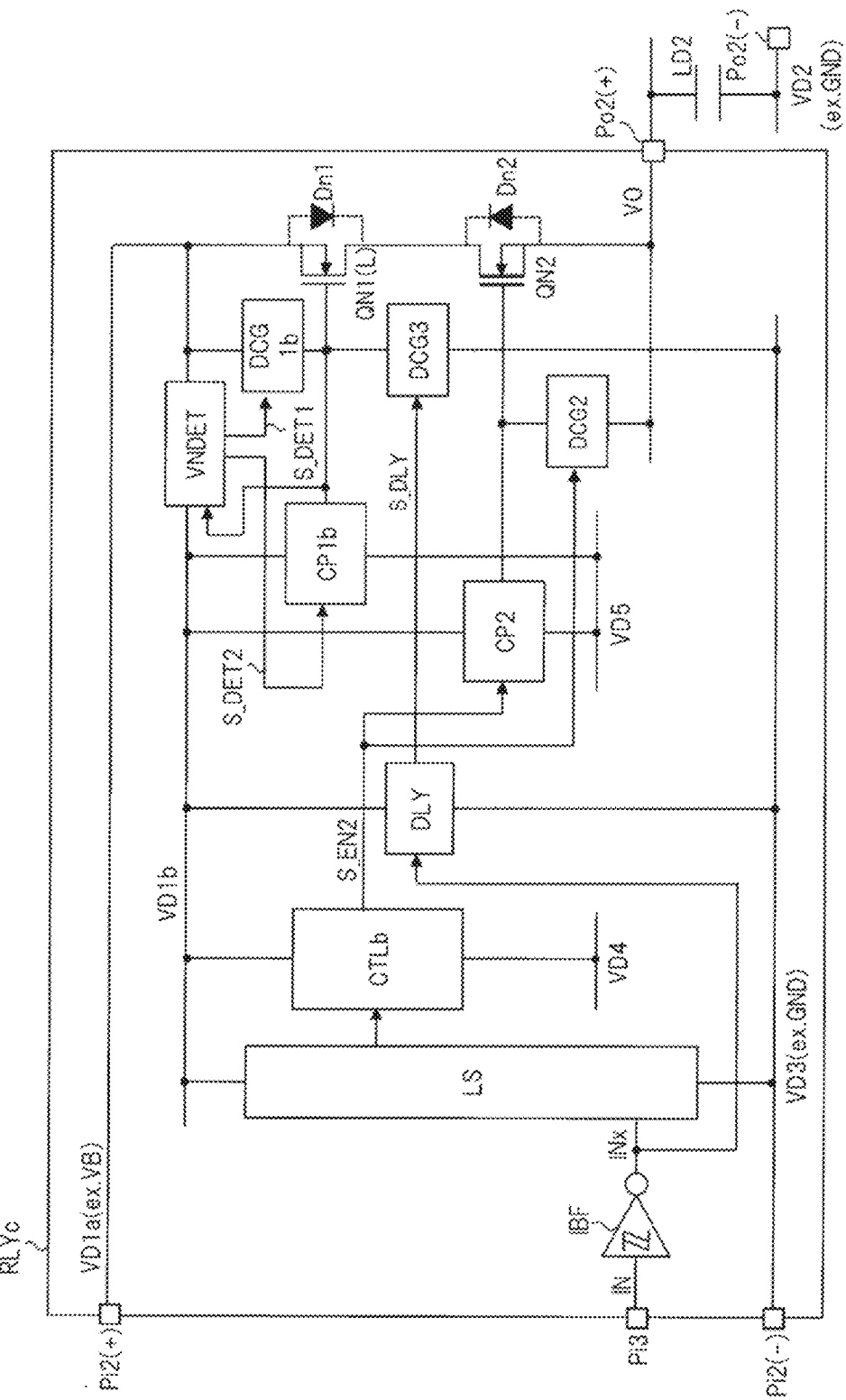
FIG. 13 is a block diagram showing a schematic configuration example of a semiconductor device (relay device) according to the third embodiment.

FIG. 13 is a block diagram showing a schematic configuration of a semiconductor device (relay device) according to the third embodiment. The semiconductor device (relay device) RLYc shown in FIG. 13 differs from the configuration shown in FIG. 7 in the following four points. The first difference is that the load LD2 is a capacitor load. As a second difference, a delay circuit DLY is added, and as a third difference, a gate discharge circuit DCG3 is added. As a fourth difference, as shown in detail in FIG. 14, the gate potential of the power transistor QN1(L) is inputted to the negative potential detecting circuit VNDET.

The delay circuit DLY outputs a delay signal S_DLY asserted for a predetermined period of time, triggered by the transition of the control signal INx output from the input buffer IBF to the negate (i.e., the transition of the control input signal IN to the negate). The gate discharge circuit DCG3 is provided between the gate of the power transistor QN1(L) and the power supply [3] VD3, and receives the delay signal S_DLY from the delay circuit DLY to discharge the gate charge of the power transistor QN1(L) toward the power supply [3] VD3.

Figure 14:
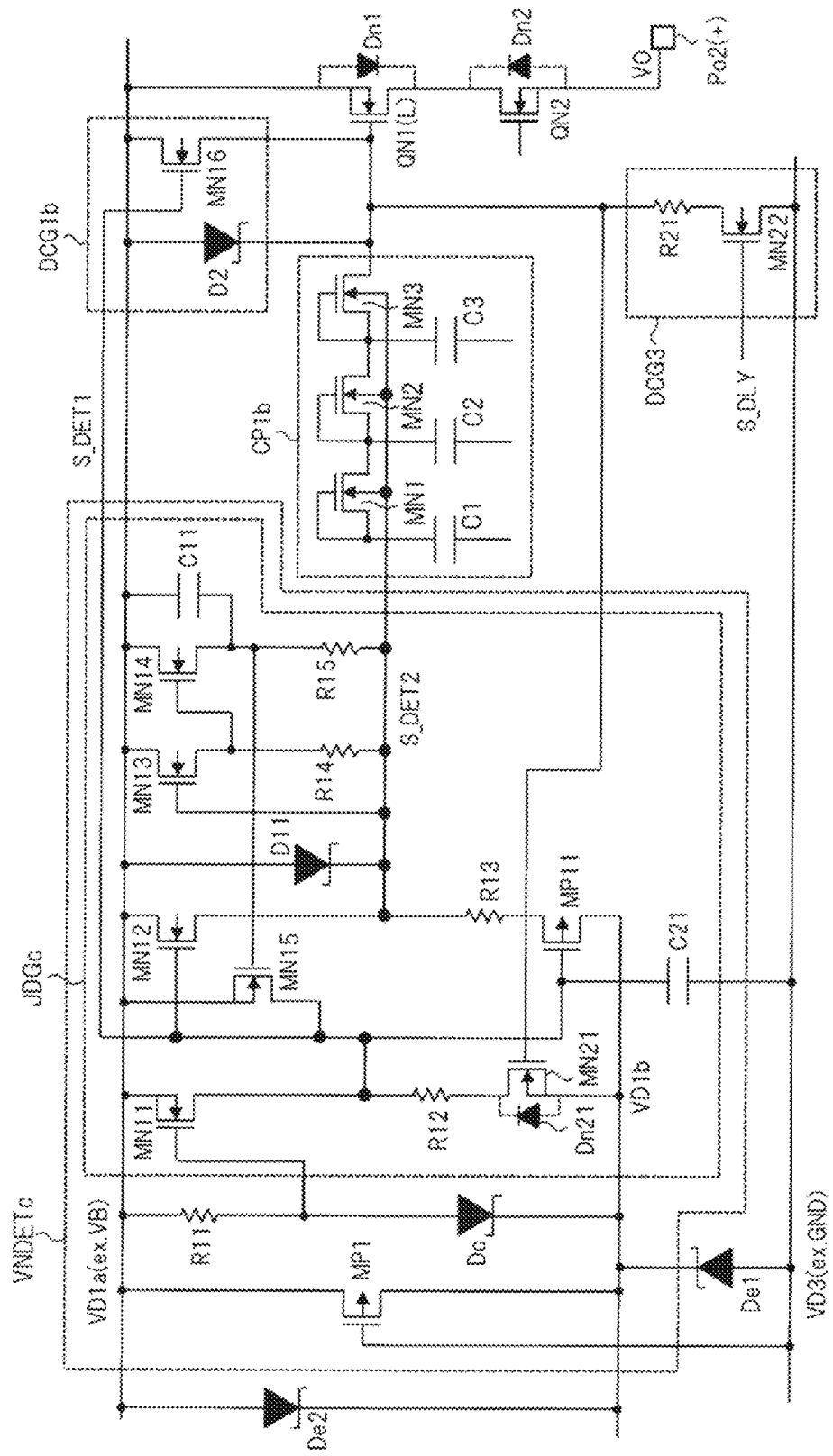
FIG. 14 is a circuit diagram illustrating a detailed configuration example of a main part in the semiconductor device (relay device) in FIG. 13.
Figure 15:
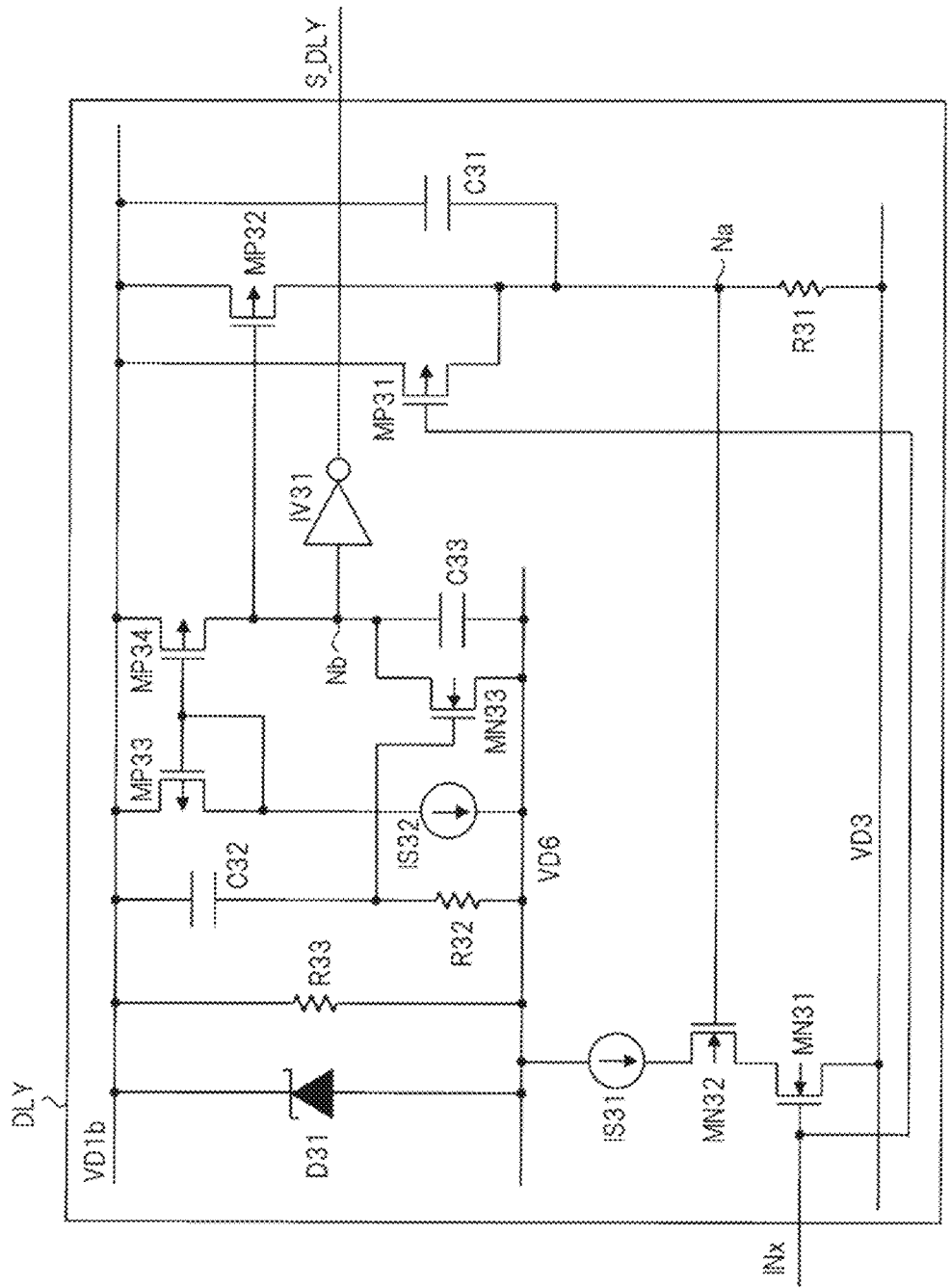
FIG. 15 is a circuit diagram illustrating a detailed configuration example of a delay circuit in FIG. 13.

FIG. 14 is a circuit diagram illustrating a detailed configuration example of the main part of the semiconductor device (relay device) shown in FIG. 13, showing the main part of the relay device (third embodiment). FIG. 15 is a circuit diagram showing a detailed configuration example of the delay circuit in FIG. 13. FIG. 14 shows examples of configurations around the negative potential detecting circuit VNDET shown in FIG. 13, around the booster circuit CP1b, around the gate discharge circuit DCG1b, and around the gate discharge circuit DCG3.

The negative potential determination circuit JDGc in the negative potential detecting circuit VNDETc (VNDET) further includes a nMOS transistor MN21 coupled in series with the resistor R12 and a capacitor C21 provided between the gate of the nMOS transistor MN16 and the power supply [3] VD3, as compared with the configuration shown in FIG. 9. The gate of the nMOS transistor MN21 is coupled to the gate of the power transistor QN1(L). The gate discharging circuitry DCG3 comprises a resistor R21 and a nMOS transistor MN22 coupled in series between the gate of the nMOS transistor MN21 (and the power transistor QN1(L)) and the power supply [3] VD3. Delayed signals S_DLY are applied to the gates of the nMOS transistors MN22.

First, an outline of the circuit shown in FIG. 14 will be described. The cause of the problems described with reference to FIG. 12 is that the nMOS transistor MN16 in the gate discharge circuit DCG1b is controlled to be turned on when the battery BAT is reversely connected, but remains off when the battery BAT is forward connected. As a result, even if the control input signal IN is negated at the time of forward connection of the battery BAT, the on state of the power transistor QN1(L) may be maintained, and therefore, charge-loss occurs at the time of cranking.

Here, the reason why the nMOS transistor MN16 is kept off is that the gate potential of the nMOS transistor MN16 follows the power supply potential [1a]VD1a. On the other hand, it is assumed that the gate potential of the nMOS transistor MN16 maintains the gate potential of the power supply potential [1a] VD1a prior to cranking without following the gate potential [1a] VD1a when the power supply potential [1a] VD1a fluctuates due to cranking. In this instance, the nMOS transistor MN16 is automatically turned on because a gate-source voltage is generated in accordance with a variation in the power supply potential [1a] VD1a. As a result, the power transistor QN1(L) can be controlled to be turned off.

Therefore, a capacitor C21 is provided which maintains the potential of the negative potential detecting signal [1]S_DET 1 prior to cranking, i.e., the gate potential of the nMOS transistor MN16. Specifically, the nMOS transistor (short-circuit transistor) MN16 is turned off when the power supply potential [1a] VD1a is applied to the gates (negative potential detecting signal [1] S_DET 1) during the assertion of the control input signal IN. The capacitor C21 maintains the gate potential of the nMOS transistor MN16 during the assertion period of the control input signal IN during the negation period of the control input signal IN.

However, since the power supply potential [1b] VD1b is interlocked with the variation of the power supply potential [1a] VD1a, if the nMOS transistor MN21 is not provided, the potential of the capacitor C21 is interlocked with the power supply potential [1b] VD1b, and the power supply potential [1a] VD1a prior to the cranking cannot be maintained. Therefore, a nMOS transistor (control transistor) MN21 is provided. The nMOS transistor MN21 is provided between the power supply [1b] VD1b (and thus the power supply [1a] VD1a (positive power supply terminal Pi2(+))) and the gates of the nMOS transistors MN16. The nMOS transistor MN21 is controlled to be off during the negation of the control input signal IN, thereby controlling the gate of the nMOS transistor MN16 to a high-impedance state.

Specifically, the gate of the nMOS transistor MN21 is coupled to the gate of the power transistor QN1(L) and has the same potential as the gate. Therefore, when a variation in the power supply potential [1a] VD1a occurs, the power supply potential [1a] VD1a is applied to the gate of the nMOS transistor MN16, and the gate potential of the power transistor QN1(L) is controlled to the power supply potential [1a] VD1a in the variation state after the cranking occurs. In the nMOS transistor MN21, the source (power supply potential [1b] VD1b fluctuates in conjunction with the fluctuating power supply potential [1a] VD1a, but since the gates also fluctuate in the same manner, they are kept off. As a result, the gate of the nMOS transistor MN16 is kept in a high-impedance condition, and the gate potential thereof is kept at the power supply potential [1a]VD1a prior to cranking by the capacitor C21.

On the other hand, for example, when the gate of the power transistor QN1(L) maintains the boosted potential prior to cranking, the power transistor QN1(L) is turned on, and the nMOS transistor MN21 is also turned on. Here, as described above, in order to turn off the nMOS transistor MN21 during the negation of the control input signal IN, the nMOS transistor MN21 needs to be initially controlled to be off when the control input signal IN transitions from the asserted level to the negated level.

Otherwise, when the power supply potential [1a] VD1a fluctuates, the negative potential detecting signal [1] S_DET1 starts to follow the power supply potential [1a] VD1a in the fluctuating state, so that the nMOS transistor MN16 is not turned on, and as a result, the nMOS transistor MN21 may also be kept on. Therefore, a gate discharge circuit DCG3 is provided. The gate discharging circuit DCG3 sets the gate potentials of the nMOS transistor MN21 and the power transistor QN1(L) to "VD1a-VF" (VF is the forward voltage of the protective diode D 2) when the control input signal IN transitions from the asserted level to the negated level. As a result, the gate discharge circuit DCG3 controls the nMOS transistor MN21 to be turned off, and in addition, the gate discharge circuit also controls the power transistor QN1(L) to be turned off.

Next, the details of the circuit shown in FIGS. 14 and 15 will be described. The delay circuit DLY shown in FIG. 15 includes nMOS transistors MN31 to MN33, pMOS transistors MP31 to MP34, resistors R31 to R33, capacitors C31 to C33, a diode D 31, a inverter IV31, and current sources IS31 and IS32. The current sources IS31 and IS32 are realized by a current mirror circuit, a depletion transistor in which a gate and a source are short-circuited, or the like. Note that the resistors R31 to R33 may be replaced with a depletion transistor or the like in which the gate and the source are short-circuited.

The current source IS31, the diode D31, and the resistor R33 generate a power supply (power supply potential) [6] VD6 which is a reference of the power supply [1b] VD1b. Control signals INx from the input buffers IBF are input to the gates of the nMOS transistor MN31 and the pMOS transistor MP31. The capacitors C32 and C33, the resistor R32, the nMOS transistor MN33, the pMOS transistors MP33 and MP34, and the inverter IV31 constitute timer circuits. Delayed signals S_DLY are outputted by the inverter IV31. The inverter IV31 also has a function of level-shifting a signal between the power supply [1b] VD1b and the power supply [6] VD6 to a signal between the power supply [1b] VD1b and the power supply [3] VD3.

In such a configuration, the control signal INx attains an asserted level, in this case, the VD3 level, in response to the assertion of the control signal IN. As a result, the nMOS transistor MN31 is turned off, and the power supply [1b] VD1b and the power supply [6] VD6 have the same potential. That is, the power supply [6] VD6 is deactivated without generating a predetermined power supply. The pMOS transistor MP31 is turned on, and the node Na has the same potential as the power supply [1b]VD1b.

When the control input signal IN is switched from asserted to negated, the control signal INx goes to the negated level, in this case the VD1b level, and the nMOS transistor MN31 is turned on, and at the same time the pMOS transistor MP31 is turned off. However, at this time point, since the pMOS transistor MP32 is off, the potential of the node Na changes from the power supply potential [1b] VD1b to the power supply [3] VD3 with time constants determined by the capacitor C31 and the resistor R31.

On the other hand, immediately after the control signal INx is switched from the asserted level (VD3 level) to the negated level (VD1b level), the potential of the node Na is in the vicinity of the power supply potential [1b] VD1b. Therefore, the nMOS transistor MN32 is turned on, and the power supply [6] VD6 is generated by the diode D31 and the current source IS31. That is, the power supply [6] VD6 is activated. As will be described in detail later, immediately after the power supply [6] VD6 is generated, since the potential of the node Nb is at the power supply potential [6] VD6, the pMOS transistor MP32 is on, and the on state of the nMOS transistor MN32 is maintained regardless of the time constants determined by the capacitor C31 and the resistor R31.

The capacitor C32, the resistor R32, and the nMOS transistor MN33 are provided to initialize the potential of the node Nb, and immediately after the power supply [6] VD6 is generated, the nMOS transistor MN33 is controlled to be turned on to lower the potential of the node Nb to the level of the power supply potential [6] VD6. As a result, the pMOS transistor MP32 is turned on, and as described above, the nMOS transistor MN32 is kept on regardless of the time constants of the capacitor C31 and the resistor R31.

When a predetermined period determined by the capacitor C32 and the resistor R32 elapses, the nMOS transistor MN33 is turned off. As a result, the capacitor C33 starts to be charged by the current obtained by mirroring the current of the current source IS32 by the pMOS transistors MP33 and MP34, and the potential of the node Nb changes from the power supply potential [6] VD6 to the power supply potential [1b] VD1b. The delay signal S_DLY becomes an asserted level in a period from the activation time of the power supply [6] VD6 until the potential of the node Nb reaches the threshold value of the inverter IV31, and in this period, the delay signal S_DLY turns on the nMOS transistor MN22 in the gate-discharge circuit DCG3.

When the potential of the node Nb reaches the threshold value of the inverter IV31, the delay signal S_DLY becomes a negative gate level, and the nMOS transistor MN22 in the gate discharging circuit DCG3 is turned off. The length of the assertion period of the delay signal S_DLY is appropriately set together with the resistance value of the resistor R21 in the gate discharge circuit DCG3 so that the gate charge of the power transistor QN1(L) is discharged in the assertion period of the delay signal S_DLY. When the potential of the node Nb exceeds the threshold value of the inverter IV31 and approaches the power supply potential [1b] VD1b, the pMOS transistor MP32 is turned off.

As a result, the potential of the node Na changes from the power supply potential [1b] VD1b to the power supply potential [3] VD3 in accordance with the time constants determined by the capacitor C31 and the resistor R31, and the nMOS transistor MN32 is turned off. As a result, the potential of the power supply [6] VD6 becomes the same as that of the power supply [1b]VD1b, and the current consumed by the delay circuits DLY becomes zero. The delay circuit DLY may operate only for a predetermined period when the control input signal IN is switched from asserted to negated. For this reason, after a certain period, it is desirable to deactivate the power supply [6] VD6 in this manner to eliminate the consumed current.

Figure 16:
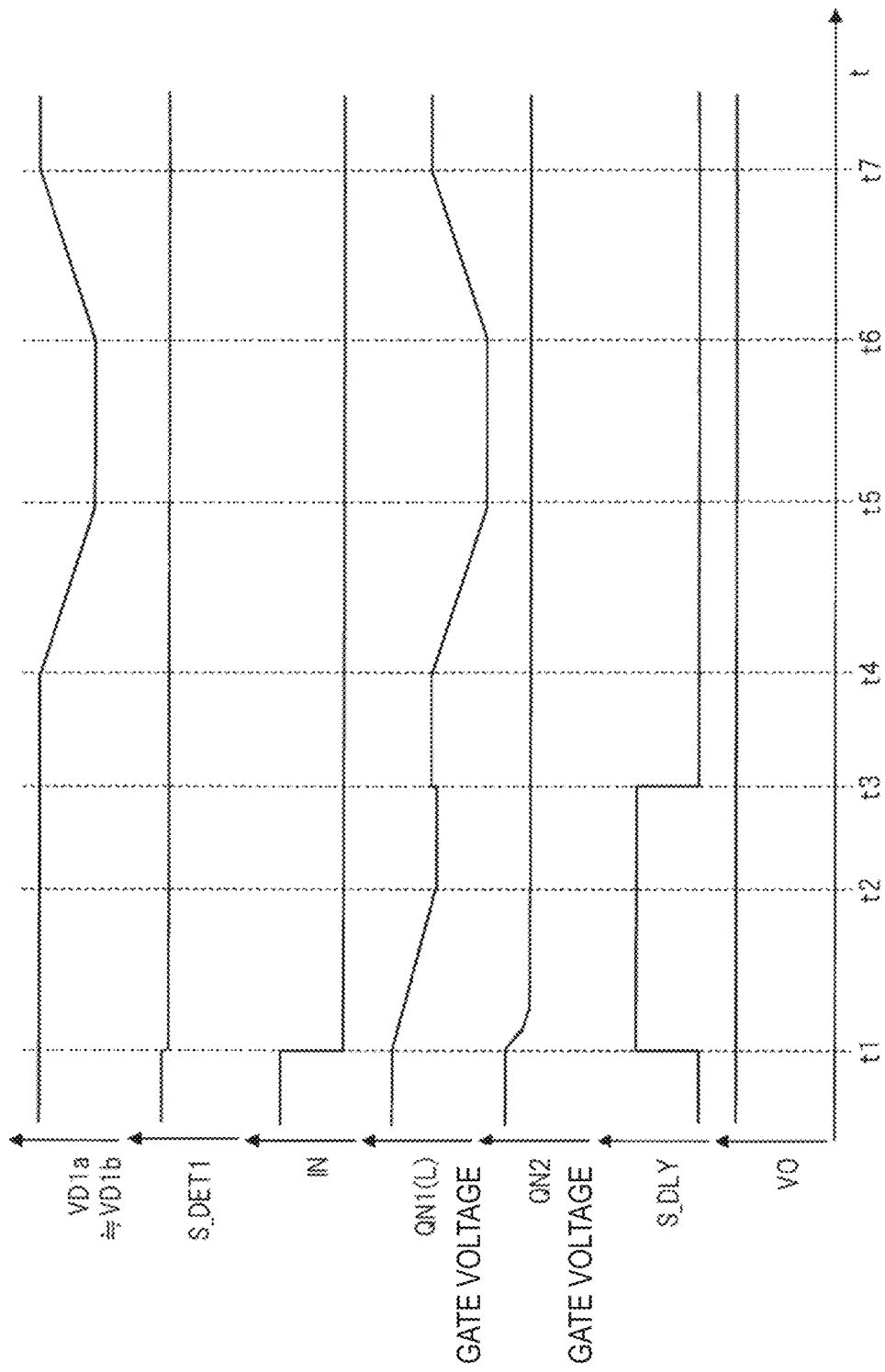
FIG. 16 is a waveform diagram showing an example of operation of the circuit in FIG. 14.

FIG. 16 is a waveform diagram showing an example of the operation of the circuit of FIG. 14. When the control input signal IN is negated, the delay signal S_DLY is asserted for a predetermined period of time, i.e., times t1 to t3. The gate charge of the power transistor QN1(L) needs to be discharged within the time period from t1 to t3, and needs to be discharged slower than the gate charge of the power transistor QN2. In this case, the gate charge of the power transistor QN1(L) is discharged at the time t 2, and the gate charge of the power transistor QN2 is discharged after the time t 1 and before the time t 2. With respect to this discharging sequence, if the power transistor QN1(L) is turned off before the power transistor QN2, the combined resistances of the power transistor QN1(L) and the power transistor QN2 may be discontinuous, resulting in switching noises.

The period from time t4 to time t7 is a period in which the potential of the power supply [1a] VD1a varies due to cranking. Since the power transistor QN1(L) is turned off at the time t2 (i.e., the gate and the source are coupled to the power supply [1a] VD1a) during the potential variation period, the potential of the capacitor loads (the output potential VO) does not pass to the power supply [1a] VD1a, unlike the case of FIG. 12.

That is, since the nMOS transistor MN11 and the nMOS transistor MN21 in FIG. 14 are off in the potential variation period, the negative potential detecting signal [1] S_DET1 is maintained at the level before the time t1 (approximately the power supply potential [1a] VD1a level before the potential variation period) by the capacitor C21. As a result, in the potential variation period, the nMOS transistor MN16 in the gate discharging circuit DCG1b controls the gate potential of the power transistor QN1(L) to be equal to the power supply potential [1a] VD1a after the potential variation period.

Note that, even if such control is not used, the gate potential of the power transistor QN1(L) follows the source potential to some extent by the gate-drain capacitance. However, since a balance between the gate-source capacitance of the power transistor QN1(L) and the charge operation of the booster CP1b associated with the residual charge of the negative potential detecting signal [2] S_DET2 can be considered, it is preferable to perform the above-described control.

In the third embodiment, in addition to performing the same operation as second embodiment, the capacitor C21 maintains the gate potential of the nMOS transistor MN16 before cranking while the nMOS transistor MN21 is off when cranking occurs at the time of negation of the control input signal IN when the battery BAT is connected in order and the control input signal IN is negated. As a result, the nMOS transistor MN16 is automatically turned on because the source potential is lowered by cranking, and the power transistor QN1(L) is turned off accordingly. When the battery BAT is reversely connected, the nMOS transistor MN21 can be turned off, but since the parasitic diode Dn21 having the power supply [1b]VD1b as the anode thereof] is conductive, the operation is the same as that of the second embodiment.

By using such a method, the same effects as those of second embodiment can be obtained. Further, the power transistor QN1(L) can be controlled to be off during the negation of the control input signal IN, and the power transistor QN1(L) can be maintained to be off even when the power supply potential [1a] VD1a fluctuates due to cranking. As a result, it is possible to prevent charge loss in the capacitor load. Here, various circuits are added to the configuration example of FIG. 9, but it is also possible to add similar circuits to the configuration example of FIG. 4.

Although the invention made by the present inventor has been specifically described based on the embodiment, the present invention is not limited to the embodiment described above, and various modifications can be made without departing from the gist thereof.

What is claimed is:

1. A semiconductor device comprising:
a positive power supply terminal and a negative power supply terminal coupled to a power supply;
a load drive terminal coupled to a load, wherein a source and a back gate of a first power transistor is coupled to the positive power supply terminal and a drain of the first power transistor is coupled to the load drive terminal, wherein a source and a back gate of a second power transistor is coupled to the load drive terminal and a drain of the second power transistor is coupled to the positive power supply terminal;
a first boost circuit for charging a gate of the first power transistor; and a first gate discharge circuit for discharging gate potential of the first power transistor to the source when the potential of the negative power terminal is higher than the potential of the positive power terminal,
wherein the first gate discharge circuit comprises an n-channel type short circuit transistor for shorting the gate of the first power transistor to the source when the potential of the negative power terminal is higher than the potential of the positive power terminal.

2. The semiconductor device according to claim 1, wherein the semiconductor device is formed by a semiconductor package.

3. The semiconductor device according to claim 2, wherein the first gate discharge circuit has a second resistor for passing a gate discharge current smaller than a gate charge current generated when a first booster circuit turns on the first power transistor.

4. The semiconductor device according to claim 2, further comprising:
a second booster circuit for charging the gate of the second power transistor when a control input signal is asserted; and
a second gate discharge circuit for discharging the gate charge of the second power transistor to the source when the control input signal is negated.

5. The semiconductor device according to claim 1, further comprising:
a negative potential detecting circuit for determining whether the negative potential applied to the positive power supply terminal is on a positive side or on a negative side of a predetermined negative threshold potential with reference to the negative power supply terminal, and for controlling the short circuit transistor to be on in a first case of the positive side, and for controlling a short-circuit transistor to be off in a second case of the negative side.

6. The semiconductor device according to claim 5, wherein the negative potential detecting circuit has a first resistor and a first zener diode provided in series between the positive power supply terminal and the negative power supply terminal, and the negative potential detecting circuit determines whether the negative threshold potential is on the positive side or on the negative side by detecting whether the first zener diode breaks down.

7. The semiconductor device according to claim 5, wherein the negative potential detecting circuit has a second zener diode having one end coupled to the positive power supply terminal, and in a second semiconductor device, a potential which is positive by a breakdown voltage of the second zener diode is applied to the gates of the first power transistors via a first booster circuit with reference to the potential of the positive power supply terminal.

8. The semiconductor device according to claim 5, wherein the first power transistor has a lower pressure structure than the second power transistor.

9. The semiconductor device according to claim 1, wherein the short circuit transistor is turned off when the potential of the positive power supply terminal is applied to the gate during an assertion period of a control input signal, and the semiconductor device further includes a capacitor that maintains the gate potential of the short circuit transistor during the assertion period of the control input signal during a negation period of the control input signal.

10. The semiconductor device according to claim 9, further comprising:
a control transistor provided between the positive power supply terminal and the gate of the short circuit transistor, the control transistor controlling the gate of the short circuit transistor to be in a high-impedance condition by being controlled to be off in the negation period of the control input signal.

11. An electronic control device comprising:
a microcontroller and a relay device and a battery and a load,
wherein the relay device is comprising:
a positive power supply terminal and a negative power supply terminal coupled to the battery;
a load drive terminal coupled to the load, wherein a source and a back gate of a first power transistor is coupled to the positive power supply terminal and a drain of the first power transistor is coupled to the load drive terminal, wherein a source and a back gate of a second power transistor is coupled to the load drive terminal and a drain of the second power transistor is coupled to the positive power supply terminal;
a first boost circuit for charging a gate of the first power transistor; and
a first gate discharge circuit for discharging gate potential of the first power transistor to the source when the potential of the negative power terminal is higher than the potential of the positive power terminal,
wherein the first gate discharge circuit comprises an n-channel type short circuit transistor for shorting the gate of the first power transistor to the source when the potential of the negative power terminal is higher than the potential of the positive power terminal.

12. The electronic control device according to claim 11, wherein the relay device further includes a negative potential detecting circuit for determining whether the negative potential applied to the positive power supply terminal is on a positive side or on a negative side of a predetermined negative threshold potential with reference to the negative power supply terminal, and for controlling the short circuit transistor to be on in a first case of the positive side, and for controlling a short-circuit transistor to be off in a second case of the negative side.

13. The electronic control device according to claim 12, wherein the negative potential detecting circuit has a first resistor and a first zener diode provided in series between the positive power supply terminal and the negative power supply terminal, and the negative potential detecting circuit determines whether the negative threshold potential is on the positive side or on the negative side by detecting breakdown of the first zener diode.

14. The electronic control device according to claim 12, wherein the negative potential detecting circuit has a second zener diode coupled one end to the positive power supply terminal, and
wherein in the second case, a potential which is positive by a breakdown voltage of the second zener diode is applied to the gate of the first power transistor via a first booster circuit with reference to the potential of the positive power supply terminal.

15. The electronic control device according to claim 12, wherein the first power transistor has a lower pressure structure than the second power transistor.

16. The electronic control device according to claim 12, wherein the short circuit transistor is turned off when the potential of the positive power supply terminal is applied to the gate during an assertion period of a control input signal, and
wherein the relay device further has a capacitor that maintains the gate potential of the short circuit transistor during the assertion period of the control input signal during a negation period of the control input signal.

17. The electronic control device according to claim 16, wherein the relay device further has a control transistor provided between the positive power supply terminal and the gate of the short circuit transistor, and wherein the control transistor controls the gate of the short circuit transistor to be in a high impedance condition by being turned off during the negation period of the control input signal.

18. The electronic control device according to claim 11, wherein the electronic control device is mounted on a vehicle.

19. A semiconductor device comprising:

a positive power supply terminal and a negative power supply terminal coupled to a power supply;

a load drive terminal coupled to a load, wherein a source and a back gate of a first power transistor is coupled to the positive power supply terminal and a drain of the first power transistor is coupled to the load drive terminal, wherein a source and a back gate of a second power transistor is coupled to the load drive terminal and a drain of the second power transistor is coupled to the positive power supply terminal; and a first boost circuit for charging a gate of the first power transistor; and a first gate discharge circuit for discharging gate potential of the first power transistor to the source when the potential of the negative power terminal is higher than the potential of the positive power terminal, wherein the first gate discharge circuit has a second resistor for passing a gate discharge current smaller than a gate charge current generated when a first booster circuit turns on the first power transistor.

* * * * *